(12) United States Patent
Inoue et al.

(10) Patent No.: US 9,159,934 B2
(45) Date of Patent: Oct. 13, 2015

(54) ORGANIC MATERIAL, LIGHT-EMITTING ELEMENT, LIGHT-EMITTING DEVICE, ELECTRONIC APPLIANCE, AND LIGHTING DEVICE

(71) Applicant: Semiconductor Energy Laboratory Co., Ltd., Kanagawa-ken (JP)

(72) Inventors: Hideko Inoue, Kanagawa (JP); Yasushi Kitano, Kanagawa (JP); Takao Hamada, Kanagawa (JP); Satoshi Seo, Kanagawa (JP); Hiroki Suzuki, Kanagawa (JP); Tomohiro Kubota, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 13/905,720

(22) Filed: May 30, 2013

(65) Prior Publication Data

US 2013/0323869 A1 Dec. 5, 2013

(30) Foreign Application Priority Data

Jun. 1, 2012 (JP) ................................. 2012-126112

(51) Int. Cl.
*H01L 21/00* (2006.01)
*H01L 51/00* (2006.01)
(52) U.S. Cl.
CPC ........ *H01L 51/0072* (2013.01); *H01L 51/0074* (2013.01); *H01L 51/006* (2013.01); *H01L 51/0085* (2013.01); *H01L 2251/308* (2013.01)
(58) Field of Classification Search
USPC .......................................... 438/22, 29, 99, 46
See application file for complete search history.

(56) References Cited

U.S. PATENT DOCUMENTS 7,601,435 B2 10/2009 Shitagaki et al.
7,931,974 B2 4/2011 Egawa et al.
8,084,146 B2 12/2011 Murase et al.
(Continued)

FOREIGN PATENT DOCUMENTS

EP 1 962 354 A1 8/2008
JP 2007-189001 7/2007
(Continued)

OTHER PUBLICATIONS

Molander et al., "Palladium-Catalyzed, Direct Boronic Acid Synthesis from Aryl Chlorides: A Simplified Route to Diverse Boronate Ester Derivatives", J. Am Chem Soc. Dec. 22, 2010; 132(50): 17701-17703.*

(Continued)

*Primary Examiner* — Reema Patel
(74) *Attorney, Agent, or Firm* — Husch Blackwell LLP

(57) ABSTRACT

A novel organic material with fewer impurities, a light-emitting element including the organic material, and a light-emitting device, an electronic appliance, and a lighting device each of which includes the light-emitting element are provided. The organic material is obtained by coupling an aryl halide and an aryl boronic acid or an aryl boronic acid ester. The aryl boronic acid or the aryl boronic acid ester includes at least one of a first impurity in which a boryl group of the aryl boronic acid or the aryl boronic acid ester is substituted by hydrogen and a second impurity in which a molecular mass of 16 or 17 is added to the molecular mass of the first impurity. The concentration of an impurity other than the first impurity and the second impurity is 1% or lower.

17 Claims, 18 Drawing Sheets

(56) References Cited

U.S. PATENT DOCUMENTS

| | | | |
|---|---|---|---|
| 8,231,984 | B2 | 7/2012 | Shitagaki et al. |
| 8,252,433 | B2 | 8/2012 | Egawa et al. |
| 2008/0315754 | A1* | 12/2008 | Kawamura et al. ............ 313/504 |
| 2009/0140641 | A1 | 6/2009 | Nomura et al. |
| 2009/0140642 | A1 | 6/2009 | Kadoma et al. |
| 2009/0153041 | A1 | 6/2009 | Kawakami et al. |
| 2009/0184633 | A1 | 7/2009 | Kadoma et al. |
| 2009/0203704 | A1 | 8/2009 | Kadoma et al. |
| 2010/0090588 | A1 | 4/2010 | Yokoyama et al. |
| 2010/0109555 | A1* | 5/2010 | Ichimura et al. ............... 315/291 |
| 2010/0249349 | A1 | 9/2010 | Chebotareva et al. |
| 2011/0089407 | A1 | 4/2011 | Schmidhalter et al. |
| 2011/0210316 | A1 | 9/2011 | Kadoma et al. |
| 2012/0126221 | A1* | 5/2012 | Kitamura et al. ................ 257/40 |
| 2012/0197020 | A1 | 8/2012 | Osaka et al. |

FOREIGN PATENT DOCUMENTS

| | | |
|---|---|---|
| JP | 2008-106051 | 5/2008 |
| JP | 2008-239613 | 10/2008 |
| JP | 2009-149629 | 7/2009 |
| JP | 2009-149631 | 7/2009 |
| JP | 2009-149632 | 7/2009 |
| JP | 2009-526111 | 7/2009 |
| JP | 2011-201869 | 10/2011 |
| TW | 200940554 | 10/2009 |
| WO | WO 03/058667 A1 | 7/2003 |
| WO | WO 2004/043937 A1 | 5/2004 |
| WO | WO 2004/094389 A1 | 11/2004 |
| WO | WO 2005/019229 A1 * | 3/2005 ............... C07F 5/02 |
| WO | WO 2005/113531 A1 | 12/2005 |
| WO | WO 2007/069569 A1 | 6/2007 |
| WO | WO 2007/090773 A1 | 8/2007 |
| WO | WO 2008/023628 A1 | 2/2008 |
| WO | WO 2008/031743 A1 | 3/2008 |
| WO | WO 2009/100991 A1 | 8/2009 |

OTHER PUBLICATIONS

Mothana, S. et al., "Multistep Phase-Switch Synthesis by Using Liquid-Liquid Partitioning of Boronic Acids: Productive Tags with an Expanded Repertoire of Compatible Reactions," Angew. Chem. Int. Ed. Engl. vol. 49, No. 16, Apr. 6, 2010, pp. 2883-2887.

Mothana, S. et al., "Multistep Phase-Switch Synthesis by Using Liquid-Liquid Partitioning of Boronic Acids: Productive Tags with an Expanded Repertoire of Compatible Reactions," Angew. Chem. Int. Ed. Engl. vol. 49, No. 16, Apr. 6, 2010, pp. 2883-2887, (Supporting information—S1-42).

Mothana, S. et al., "Multistep Phase-Switch Synthesis by Using Liquid-Liquid Partitioning of Boronic Acids: Productive Tags with an Expanded Repertoire of Compatible Reactions," Angew. Chem. Int. Ed. Engl. vol. 49, Apr. 6, 2010, pp. 2883-2887.

Mothana, S. et al., "Multistep Phase-Switch Synthesis by Using Liquid-Liquid Partitioning of Boronic Acids: Productive Tags with an Expanded Repertoire of Compatible Reactions," Angew. Chem. Int. Ed. Engl. vol. 49, Apr. 6, 2010, pp. 2883-2887, (Supporting information—S1-42).

* cited by examiner

--- fluorescence spectrum of first organic compound 213
    (or second organic compound 214)
-·-· phosphorescence spectrum of first organic compound 213
    (or second organic compound 214)
—— absorption spectrum of third organic compound 215
—— emission spectrum of exciplex

ORGANIC MATERIAL, LIGHT-EMITTING ELEMENT, LIGHT-EMITTING DEVICE, ELECTRONIC APPLIANCE, AND LIGHTING DEVICE

BACKGROUND OF THE INVENTION

1. Field of the Invention

The present invention relates to an organic material and a light-emitting element using the organic material. The present invention also relates to a light-emitting device, an electronic appliance, and a lighting device each of which includes the light-emitting element.

2. Description of the Related Art

In recent years, research and development have been actively conducted on light-emitting elements utilizing electroluminescence (EL). In a basic structure of such a light-emitting element, a layer including a substance having a light-emitting property is interposed between a pair of electrodes. By applying voltage to this element, light emission can be obtained from the substance having a light-emitting property.

An organic compound is mainly used as an EL material for an EL layer in a light-emitting element and greatly contributes to an improvement in the characteristics of the light-emitting element. For this reason, a variety of novel organic compounds have been developed (e.g., Patent Document 1).

[Patent Document 1] Japanese Published Patent Application No. 2011-201869

SUMMARY OF THE INVENTION

It is preferable to employ an inexpensive material or a simple method in synthesizing an organic compound. However, there is a problem in that an impurity is easily mixed into the material or the organic compound at the time of the synthesis. The impurity, in many cases, cannot be technically removed in a purification process in the synthesis and remains in an intermediate or an organic material that is a final product. In addition, manufacturing a light-emitting element with the use of the organic material in which the impurity remains causes a problem of a deterioration of the characteristics of the light-emitting element or a decline in the reliability of the light-emitting element.

In view of the above problems, an object of one embodiment of the present invention is to provide a novel organic material with fewer impurities. Another object is to provide a light-emitting element including the organic material. Another object is to provide a light-emitting device, an electronic appliance, and a lighting device each of which includes the light-emitting element.

One embodiment of the present invention is an organic material which can be obtained by coupling an aryl halide and an aryl boronic acid or an aryl boronic acid ester. The aryl boronic acid or the aryl boronic acid ester includes at least one of a first impurity in which a boryl group of the aryl boronic acid or the aryl boronic acid ester is substituted by hydrogen and a second impurity in which a molecular mass of 16 or 17 is added to the molecular mass of the first impurity. The concentration of an impurity other than the first impurity and the second impurity is 1% or lower. Note that the first impurity is, in other words, arene obtained by substituting a boryl group of the aryl boronic acid or the aryl boronic acid ester with hydrogen.

Note that the concentration of an impurity in an aryl boronic acid or an aryl boronic acid ester can be measured by ultra high performance liquid chromatography (UPLC).

When a light-emitting element is manufactured using an organic material which can be obtained by coupling an aryl halide and a high-purity aryl boronic acid or aryl boronic acid ester which has a concentration of an impurity, other than the first impurity and the second impurity, of 1% or lower, the characteristics and reliability of the light-emitting element can be improved. In particular, the reliability of the light-emitting element is significantly improved by using the organic material which can be obtained by coupling the aryl halide and the high-purity aryl boronic acid or aryl boronic acid ester.

The inventors have found that the reliability of an organic material that is a final product is improved by removing an impurity (other than a first impurity and a second impurity), which cannot be removed even by purification of the organic material after coupling, before an aryl boronic acid or an aryl boronic acid ester is subjected to the coupling. The impurity in the organic material that cannot be removed after the coupling, in some cases, cannot be detected or is not detected by analysis. This phenomenon occurs probably because the impurity is taken into the organic material in a very small quantity. Since the molecular mass of the organic material after the coupling is higher than that of materials before the coupling, the taken impurity is difficult to detect in the case of a small quantity.

Note that even if the first impurity and/or the second impurity are/is mixed into the aryl boronic acid or the aryl boronic acid ester, the reliability of the light-emitting element including the organic material which is synthesized using the aryl boronic acid or the aryl boronic acid ester is not adversely affected. That is, in the case where the yield of the organic material is not considered, the first impurity and/or the second impurity may be included (specifically, at a concentration of 1% or higher) in the aryl boronic acid or the aryl boronic acid ester, and the other impurity need to be sufficiently reduced (specifically, to a concentration of 1% or lower).

As described above, according to one embodiment of the present invention, an impurity in an aryl boronic acid or an aryl boronic acid ester which is not yet subjected to coupling is removed to increase the purity of the aryl boronic acid or the aryl boronic acid ester, so that significant effects such as an increase in the purity of an organic material after the coupling and an improvement in the reliability of a light-emitting element using the organic material can be obtained.

Another embodiment of the present invention is an organic material which can be obtained by coupling an aryl halide and an aryl boronic acid. The aryl boronic acid includes at least one of a first impurity in which a dihydroxyboryl group of the aryl boronic acid is substituted by hydrogen and a second impurity in which a molecular mass of 16 or 17 is added to the molecular mass of the first impurity. The concentration of an impurity other than the first impurity and the second impurity is 1% or lower.

One embodiment of the present invention is an organic material which can be obtained by coupling an aryl halide and an aryl boronic acid or an aryl boronic acid ester. The aryl boronic acid or the aryl boronic acid ester includes at least one of a first impurity in which a boryl group of the aryl boronic acid or the aryl boronic acid ester is substituted by hydrogen and a second impurity in which a molecular mass of 16 or 17 is added to the molecular mass of the first impurity. The concentration of an impurity other than the first impurity and the second impurity is 0.5% or lower.

Another embodiment of the present invention is an organic material which can be obtained by coupling an aryl halide and an aryl boronic acid. The aryl boronic acid includes at least one of a first impurity in which a dihydroxyboryl group of the aryl boronic acid is substituted by hydrogen and a second impurity obtained in which a molecular mass of 16 or 17 is added to the molecular mass of the first impurity. The concentration of an impurity other than the first impurity and the second impurity is 0.5% or lower.

Note that each of the first impurity and the second impurity is a hydride or an oxide which is formed as a by-product when the aryl boronic acid or the aryl boronic acid ester is synthesized and can be removed by purifying an organic material during or after coupling. However, an impurity other than the first impurity and the second impurity is difficult to remove even if the organic material is purified during the coupling or after the coupling. In other words, there is a high possibility that the impurity other than the first impurity and the second impurity in the aryl boronic acid is mixed into the organic material after the coupling as an impurity. However, in the organic material of one embodiment of the present invention, the concentration of the impurity other than the first impurity and the second impurity can be reduced to 1% or lower, preferably 0.5% or lower; thus, the impurity in the organic material after the coupling can be reduced.

In the above structure, it is preferable that the aryl boronic acid be a phenylboronic acid having a substituent, and it is more preferable that the phenylboronic acid having the substituent have a molecular mass of 100 to 1000. The molecular mass of the phenylboronic acid is preferably within the above range, in which case coupling can be easily performed, or evaporation efficiency can be increased when an organic material is evaporated after coupling.

In the above structure, it is preferable that a skeleton of the substituent include a condensed heteroaromatic ring, and it is more preferable that the condensed heteroaromatic ring be a dibenzothiophene ring or a dibenzofuran ring.

When the skeleton of the substituent has the above structure, the skeleton has a high hole-transport property, which enables an organic material after coupling to have a hole-transport property.

Another embodiment of the present invention is a light-emitting element using the organic material with the above structure. Further, one embodiment of the present invention includes, in its category, a light-emitting device including the light-emitting element, and an electronic appliance and a lighting device including the light-emitting devices. Therefore, the light-emitting device in this specification refers to an image display device and a light source (e.g., a lighting device). In addition, the light-emitting device includes, in its category, all of the following modules: a module in which a light-emitting device is connected to a connector such as a flexible printed circuit (FPC) or a tape carrier package (TCP), a module in which a printed wiring board is provided on the end of a TCP, and a module in which an integrated circuit (IC) is directly mounted on a light-emitting element by a chip on glass (COG) method.

Any of the organic materials of embodiments of the present invention can be used for all kinds of organic devices, for example, a display element or a light-emitting element using organic EL, a semiconductor device using an organic semiconductor, and an organic thin-film solar cell.

One embodiment of the present invention enables a novel organic material with fewer impurities to be provided. In addition, a light-emitting element including the organic material can be provided. Furthermore, a light-emitting device, an electronic appliance, and a lighting device each of which includes the light-emitting element can be provided.

DETAILED DESCRIPTION OF THE INVENTION

Figure 1:
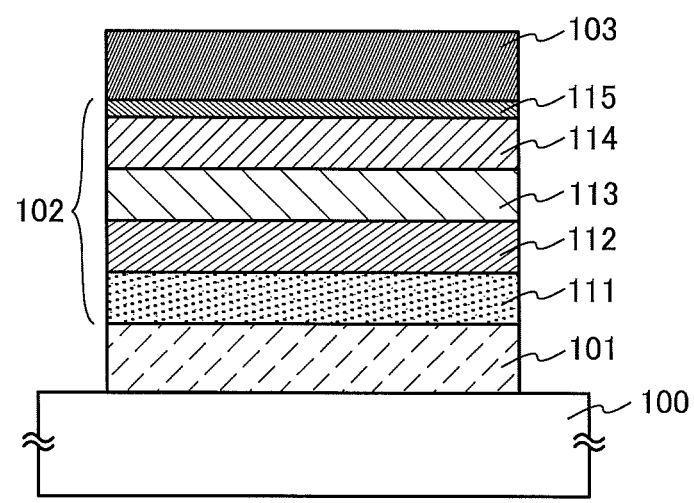
FIG. 1 illustrates a light-emitting element of one embodiment of the present invention.

Hereinafter, embodiments of the present invention will be described with reference to the drawings. Note that the present invention is not limited to the following description, and it will be easily understood by those skilled in the art that various changes and modifications can be made without departing from the spirit and scope of the present invention. Therefore, the invention should not be construed as being limited to the description in the following embodiments.

(Embodiment 1)

In this embodiment, an organic material of one embodiment of the present invention will be described.

The organic material of one embodiment of the present invention is an organic material which can be obtained by coupling an aryl halide and an aryl boronic acid or an aryl boronic acid ester. The aryl boronic acid or the aryl boronic acid ester includes at least one of a first impurity in which a boryl group of the aryl boronic acid or the aryl boronic acid ester is substituted by hydrogen and a second impurity in which a molecular mass of 16 or 17 is added to the molecular mass of the first impurity. The concentration of an impurity other than the first impurity and the second impurity is 1% or lower.

The organic material of one embodiment of the present invention can be formed, for example, by a method shown in Synthesis Scheme (a-1) given below.

[1]

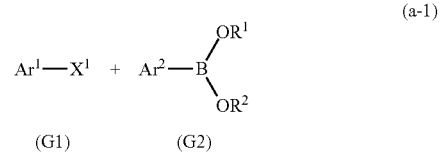

In Synthesis Scheme (a-1), $Ar^1$ and $Ar^2$ each represent an aryl group having 6 to 13 carbon atoms. The aryl group may have substituents which may be bonded to each other to form a ring. In addition, $R^1$ and $R^2$ each represent any of hydrogen and an alkyl group having 1 to 6 carbon atoms, and $R^1$ and $R^2$ may be bonded to each other to form a ring. Furthermore, $X^1$ represents a halogen group; iodine, bromine, and chlorine are preferred in descending order of reactivity.

As shown in Synthesis Scheme (a-1), an aryl halide (G1) and an aryl boronic acid or an aryl boronic acid ester (G2) are coupled by the Suzuki-Miyaura coupling reaction, cross-coupling reaction with a palladium catalyst, or the like, whereby the organic material described in this embodiment can be synthesized. Note that the molecular mass of the aryl boronic acid or the aryl boronic acid ester represented by General Formula (G2) is preferably 100 to 1000.

The molecular mass of the aryl boronic acid or the aryl boronic acid ester represented by General Formula (G2) within the above range allows evaporation efficiency to be increased, for example, when the organic material of one embodiment of the present invention is evaporated with an evaporation apparatus.

Note that $R^1$ and $R^2$ of the aryl boronic acid or the aryl boronic acid ester represented by General Formula (G2) each preferably represent hydrogen. In other words, the aryl boronic acid represented by General Formula (G2) is preferable to the aryl boronic acid ester represented by General Formula (G2), and a boryl group of the aryl boronic acid or the aryl boronic acid ester is a dihydroxyboryl group.

The aryl boronic acid or the aryl boronic acid ester (G2) shown in Synthesis Scheme (a-1) can be specifically represented by General Formula (G2-1) given below.

[2]

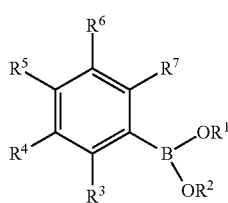

(G2-1)

In General Formula (G2-1), $R^1$ and $R^2$ each represent any of hydrogen and an alkyl group having 1 to 6 carbon atoms, and $R^1$ and $R^2$ may be bonded to each other to form a ring. In addition, $R^3$ to $R^7$ each represent hydrogen, an alkyl group having 1 to 4 carbon atoms, or a substituted or unsubstituted aryl group having 6 to 13 carbon atoms. Note that the molecular mass of the aryl boronic acid or the aryl boronic acid ester represented by General Formula (G2-1) is preferably 100 to 1000.

The molecular mass of the aryl boronic acid or the aryl boronic acid ester represented by General Formula (G2-1) within the above range allows evaporation efficiency to be increased, for example, when the organic material of one embodiment of the present invention is evaporated with an evaporation apparatus.

Note that $R^1$ and $R^2$ of the aryl boronic acid or the aryl boronic acid ester represented by General Formula (G2-1) each preferably represent hydrogen. In other words, the aryl boronic acid represented by General Formula (G2-1) is preferable to the aryl boronic acid ester represented by General Formula (G2-1), and a boryl group of the aryl boronic acid or the aryl boronic acid ester is preferably a dihydroxyboryl group.

The above aryl boronic acid or the aryl boronic acid ester (G2-1) is preferably a phenylboronic acid having a substituent. The molecular mass of the phenylboronic acid is preferably 100 to 1000.

The molecular mass of the phenylboronic acid within the above range allows evaporation efficiency to be increased, for example, when the organic material of one embodiment of the present invention is evaporated with an evaporation apparatus.

In the above aryl boronic acid or aryl boronic acid ester having a substituent (G2-1), a skeleton of the substituent preferably includes a condensed heteroaromatic ring. It is particularly preferable that the condensed heteroaromatic ring be a dibenzothiophene ring or dibenzofuran ring. The aryl boronic acid or the aryl boronic acid ester (G2-1) can be represented, for example, by General Formula (G2-2) given below.

[3]

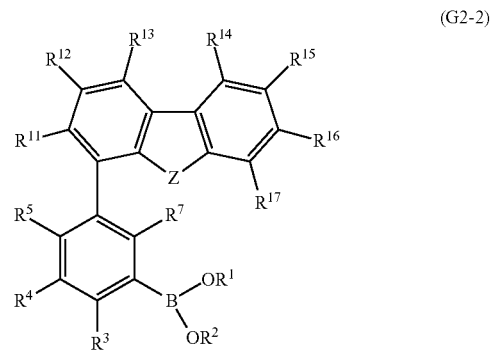

(G2-2)

In General Formula (G2-2), $R^1$ and $R^2$ each represent any of hydrogen and an alkyl group having 1 to 6 carbon atoms, and $R^1$ and $R^2$ may be bonded to each other to form a ring. In addition, $R^3$ to $R^5$ and $R^7$ each represent hydrogen, an alkyl group having 1 to 4 carbon atoms, or a substituted or unsubstituted aryl group having 6 to 13 carbon atoms. In addition, $R^{11}$ to $R^{17}$ each represent hydrogen, an alkyl group having 1 to 4 carbon atoms, or a substituted or unsubstituted aryl group having 6 to 13 carbon atoms. In addition, Z represents sulfur or oxygen.

As shown in General Formula (G2-2), when a skeleton includes a condensed heteroaromatic ring, in particular, the condensed heteroaromatic ring is a dibenzothiophene ring or a dibenzofuran ring, the skeleton has a high hole-transport property, which enables an organic material after coupling to have a hole-transport property.

The above aryl boronic acid or aryl boronic acid ester (G2, G2-1, or G2-2) includes at least one of a first impurity in which the boryl group of the aryl boronic acid or the aryl boronic acid ester is substituted by hydrogen and a second impurity in which a molecular mass of 16 or 17 is added to the molecular mass of the first impurity. The concentration of an impurity other than the first impurity and the second impurity is preferably 1% or lower. Moreover, the concentration of the impurity other than the first impurity and the second impurity is further preferably 0.5% or lower.

When a light-emitting element is manufactured using the organic material which can be obtained by coupling the aryl halide and the high-purity aryl boronic acid or aryl boronic acid ester which has a concentration of the impurity, other than the first impurity and the second impurity, of 1% or lower, more preferably 0.5% or lower, the characteristics and reliability of the light-emitting element can be improved. In particular, the reliability of the light-emitting element is significantly improved by using the organic material which is obtained by coupling the aryl halide and the high-purity aryl boronic acid or aryl boronic acid ester.

For example, the following two methods are given as methods of reducing the impurity concentration of an aryl boronic acid or an aryl boronic acid ester.

(Method 1)

One of the two methods of reducing the impurity concentration of an aryl boronic acid or an aryl boronic acid ester is described below. The purity of a material before synthesis of the aryl boronic acid or the aryl boronic acid ester, for example, an aryl bromide that is one aryl halide is increased, so that the impurity concentration of the aryl boronic acid or the aryl boronic acid ester can be lowered. Specifically, in the case where the purity of 4-(3-bromophenyl)dibenzothiophene that is an aryl bromide is lower than 90% and 3-(dibenzothiophen-4-yl)phenylboronic acid that is an aryl boronic acid is synthesized using 4-(3-bromophenyl)dibenzothiophene, the concentration of the impurity other than the first impurity and the second impurity in 3-(dibenzothiophen-4-yl)phenylboronic acid is 2% or higher. Meanwhile, in the case where the purity of 4-(3-bromophenyl)dibenzothiophene is 90% or higher and 3-(dibenzothiophen-4-yl)phenylboronic acid is synthesized using 4-(3-bromophenyl)dibenzothiophene, the concentration of the impurity other than the first impurity and the second impurity in 3-(dibenzothiophen-4-yl)phenylboronic acid can be 1% or lower, more preferably, 0.5% or lower.

(Method 2)

The other method of reducing the impurity concentration of an aryl boronic acid or an aryl boronic acid ester is described below. Even if an aryl boronic acid or an aryl boronic acid ester has low purity, the impurity concentration of the aryl boronic acid or the aryl boronic acid ester can be lowered by purifying the aryl boronic acid or the aryl boronic acid ester which is not yet subjected to coupling. Meanwhile, even if an organic material obtained by coupling using an aryl boronic acid or an aryl boronic acid ester with low purity is purified, for example, by recrystallization, it is difficult to lower the concentration of the impurity which has an adverse effect on the reliability of the organic material.

As a purification method of lowering the impurity concentration of an aryl boronic acid or an aryl boronic acid ester, the following treatment method with a polyol can be employed.

In separate phases of an organic phase (State A) of an aryl boronic acid or an aryl boronic acid ester and an aqueous phase, the aqueous phase is removed to remove an impurity that is soluble in water, and then a polyol and a basic aqueous solution are added. The addition of the polyol and the basic aqueous solution makes the aryl boronic acid or the aryl boronic acid ester soluble in water (State B: aqueous phase), and the organic phase is removed, so that an impurity and a reactant that are insoluble in water can be removed. Then, the aqueous phase is acidified by addition of an organic solvent, so that the aryl boronic acid or the aryl boronic acid ester returns to an organic phase (State C) and the polyol returns to an aqueous phase; the organic phase and the aqueous phase are separated. After that, the organic phase is extracted and concentrated, so that a high-purity aryl boronic acid or aryl boronic acid ester can be obtained. In other words, the phase of the aryl boronic acid or the aryl boronic acid ester is switched in the following order: State A (organic phase), State B (aqueous phase), and State C (organic phase), whereby an impurity in the aryl boronic acid or the aryl boronic acid ester can be removed.

As described above, although an aryl boronic acid or an aryl boronic acid ester which can be obtained by either the above method 1 or method 2 includes at least one of the first impurity in which a boryl group of the aryl boronic acid or the aryl boronic acid ester is substituted by hydrogen and the second impurity in which a molecular mass of 16 or 17 is added to the molecular mass of the first impurity, the concentration of the impurity other than the first impurity and the second impurity can be 1% or lower, more preferably 0.5% or lower.

As described above, according to one embodiment of the present invention, the impurity in the aryl boronic acid or the aryl boronic acid ester which is not yet subjected to coupling is removed to increase the purity of the aryl boronic acid or the aryl boronic acid ester, so that significant effects such as an increase in the purity of the organic material after the coupling and an improvement in the reliability of a light-emitting element using the organic material can be obtained.

Note that the structure described in this embodiment can be combined as appropriate with any of the structures described in the other embodiments.

(Embodiment 2)

In this embodiment, a light-emitting element using the organic material of one embodiment of the present invention will be described with reference to FIG. 1.

In a light-emitting element of this embodiment, an EL layer including at least a light-emitting layer is interposed between a pair of electrodes. The EL layer may also include a plurality of layers in addition to the light-emitting layer. The plurality of layers are a combination of layers including a substance with a high carrier-injection property and a substance with a high carrier-transport property, which are stacked so that a light-emitting region is formed in a region away from the electrodes, that is, so that the carriers are recombined in an area away from the electrodes. In this specification, the layer including a substance with a high carrier-injection property or a high carrier-transport property is also referred to as a functional layer which has a function of, for example, injecting or transporting carriers. As the functional layer, a hole-injection layer, a hole-transport layer, an electron-injection layer, an electron-transport layer, or the like can be used.

In the light-emitting element of this embodiment illustrated in FIG. 1, an EL layer 102 including a light-emitting layer 113 is provided between a pair of electrodes, a first electrode 101 and a second electrode 103. The EL layer 102 includes a hole-injection layer 111, a hole-transport layer 112, the light-emitting layer 113, an electron-transport layer 114, and an electron-injection layer 115. The light-emitting element in FIG. 1 includes the first electrode 101 over a substrate 100, the hole-injection layer 111, the hole-transport layer 112, the light-emitting layer 113, the electron-transport layer 114, and the electron-injection layer 115 which are stacked in this order over the first electrode 101, and the second electrode 103 thereover. Note that, in the light-emitting element described in this embodiment, the first electrode 101 functions as an anode and the second electrode 103 functions as a cathode.

The organic material of one embodiment of the present invention can be used for the EL layer 102. In other words, the organic material of one embodiment of the present invention may be included in at least one of the hole-injection layer 111, the hole-transport layer 112, the light-emitting layer 113, the electron-transport layer 114, and the electron-injection layer 115. In particular, the organic material of one embodiment of the present invention is preferably used for the light-emitting layer 113.

A specific example in which the light-emitting element described in this embodiment is manufactured is described below.

A substrate 100 is used as a support of the light-emitting element. The substrate 100 can be made of, for example, glass, quartz, plastic, or the like. Alternatively, the substrate 100 may be a flexible substrate. The flexible substrate is a substrate that can be bent, such as a plastic substrate made of polycarbonate, polyarylate, or polyether sulfone. Alternatively, a film (made of polypropylene, polyester, polyvinyl fluoride, polyvinyl chloride, or the like), an inorganic film formed by evaporation, or the like can be used. Note that another substrate can be used as long as it can function as a support in a process of manufacturing the light-emitting element.

As the first electrode 101 and the second electrode 103, a metal, an alloy, an electrically conductive compound, a mixture thereof, and the like can be used. Specifically, indium oxide-tin oxide (ITO: indium tin oxide), indium oxide-tin oxide containing silicon or silicon oxide, indium oxide-zinc oxide, indium oxide containing tungsten oxide and zinc oxide, gold (Au), platinum (Pt), nickel (Ni), tungsten (W), chromium (Cr), molybdenum (Mo), iron (Fe), cobalt (Co), copper (Cu), palladium (Pd), and titanium (Ti) can be used. In addition, an element belonging to Group 1 or Group 2 of the periodic table, for example, an alkali metal such as lithium (Li) or cesium (Cs), an alkaline earth metal such as magnesium (Mg), calcium (Ca), or strontium (Sr), an alloy containing such an element (e.g., MgAg or AlLi), a rare earth metal such as europium (Eu) or ytterbium (Yb), an alloy containing such an element, graphene, and the like can be used. The first electrode 101 and the second electrode 103 can be formed, for example, by a sputtering method, an evaporation method (including a vacuum evaporation method), or the like.

As a substance having a high hole-transport property that is used for the hole-injection layer 111 and the hole-transport layer 112, a π-electron rich heteroaromatic compound (e.g., a carbazole derivative or an indole derivative) or an aromatic amine compound is preferable; for example, the following substances can be used: a compound having an aromatic amine skeleton such as 4,4'-bis[N-(1-naphthyl)-N-phenylamino]biphenyl (abbreviation: NPB), N,N'-bis(3-methylphenyl)-N,N'-diphenyl-[1,1'-biphenyl]-4,4'-diamine (abbreviation: TPD), 4,4'-bis[N-(spiro-9,9'-bifluoren-2-yl)-N-phenylamino]biphenyl (abbreviation: BSPB), 4-phenyl-4'-(9-phenylfluoren-9-yl)triphenylamine (abbreviation: BPAFLP), 4-phenyl-3'-(9-phenylfluoren-9-yl)triphenylamine (abbreviation: mBPAFLP), 4-phenyl-4'-(9-phenyl-9H-carbazol-3-yl)triphenylam (abbreviation: PCBA1BP), 4,4'-diphenyl-4''-(9-phenyl-9H-carbazol-3-yl)triphenylamine (abbreviation: PCBBi1BP), 4-(1-naphthyl)-4'-(9-phenyl-9H-carbazol-3-yl)triphenylamine (abbreviation: PCBANB), 4,4'-di(1-naphthyl)-4''-(9-phenyl-9H-carbazol-3-yl)triphenylamine (abbreviation: PCBNBB), 9,9-dimethyl-N-phenyl-N-[4-(9-phenyl-9H-carbazol-3-yl)phenyl]fluoren-2-amine (abbreviation: PCBAF), or N-phenyl-N-[4-(9-phenyl-9H-carbazol-3-yl)phenyl]spiro-9,9'-bifluoren-2-amine (abbreviation: PCBASF); a compound having a carbazole skeleton such as 1,3-bis(N-carbazolyl)benzene (abbreviation: mCP), 4,4'-di(N-carbazolyl)biphenyl (abbreviation: CBP), 3,6-bis(3,5-diphenylphenyl)-9-phenylcarbazole (abbreviation: CzTP), or 3,3'-bis(9-phenyl-9H-carbazole) (abbreviation: PCCP); a compound having a thiophene skeleton such as 4,4',4''-(benzene-1,3,5-triyl)tri(dibenzothiophene) (abbreviation: DBT3P-II), 2,8-diphenyl-4-[4-(9-phenyl-9H-fluoren-9-yl)phenyl]dibenzothiophene (abbreviation: DBTFLP-III), or 4-[4-(9-phenyl-9H-fluoren-9-yl)phenyl]-6-phenyldibenzothiophene (abbreviation: DBTFLP-IV); and a compound having a furan skeleton such as 4,4',4''-(benzene-1,3,5-triyl)tri(dibenzofuran) (abbreviation: DBF3P-II), or 4-{3-[3-(9-phenyl-9H-fluoren-9-yl)phenyl]phenyl}dibenzofuran (abbreviation: mmDBFFLBi-II). Among the substances given above, the compound having an aromatic amine skeleton and the compound having a carbazole skeleton are preferable because these compounds are highly reliable and have high hole-transport properties to contribute to a reduction in drive voltage.

Furthermore, as a material that can be used for the hole-injection layer 111 and the hole-transport layer 112, a high molecular compound such as poly(N-vinylcarbazole) (abbreviation: PVK), poly(4-vinyltriphenylamine) (abbreviation: PVTPA), poly[N-(4-{N'-[4-(4-diphenylamino)phenyl]phenyl-N'-phenylamino}phenyl)methacrylamide] (abbreviation: PTPDMA), or poly[N,N'-bis(4-butylphenyl)-N,N'-bis(phenyl)benzidine] (abbreviation: Poly-TPD) can be used.

As each of the hole-injection layer 111 and the hole-transport layer 112, a layer in which any of the substances having a high hole-transport property given above and a substance having an acceptor property are mixed is preferably used, in which case a favorable carrier-injection property is obtained. As examples of the acceptor substance to be used, a transition metal oxide and an oxide of a metal belonging to any of Groups 4 to 8 of the periodic table can be given. Specifically, molybdenum oxide is particularly preferable.

The light-emitting layer 113 is preferably a layer which includes, for example, an electron-transport material as a host material, a hole-transport material as an assist material, and a light-emitting material, which converts triplet-excitation energy into light emission, as a guest material.

As the electron-transport material that can be used as a host material in the light-emitting layer 113, a π-electron deficient heteroaromatic compound such as a nitrogen-containing heteroaromatic compound is preferable; for example, the following can be given: heterocyclic compounds (e.g., an oxadiazole derivative, an imidazole derivative, and a triazole derivative) having polyazole skeletons, such as 2-(4-biphenylyl)-5-(4-tert-butylphenyl)-1,3,4-oxadiazole (abbreviation: PBD), 3-(4-biphenylyl)-4-phenyl-5-(4-tert-butylphenyl)-1,2,4-triazole (abbreviation: TAZ), 1,3-bis[5-(p-tert-butylphenyl)-1,3,4-oxadiazol-2-yl]benzene (abbreviation: OXD-7), 9-[4-(5-phenyl-1,3,4-oxadiazol-2-yl)phenyl]-9H-carbazole (abbreviation: CO11), 2,2',2''-(1,3,5-benzenetriyl)tris(1-phenyl-1H-benzimidazole) (abbreviation: TPBI), and 2-[3-(dibenzothiophen-4-yl)phenyl]-1-phenyl-1H-benzimidazole (abbreviation: mDBTBIm-II); heterocyclic compounds (e.g., a pyrazine derivative, a pyrimidine derivative, a pyridazine derivative, a quinoxaline derivative, and a dibenzoquinoxaline derivative) having diazine skeletons, such as 2-[3-(dibenzothiophen-4-yl)phenyl]dibenzo[f,h]quinoxaline (abbreviation: 2mDBTPDBq-II), 2-[3'-(dibenzothiophen-4-yl)biphenyl-3-yl]dibenzo[f,h]quinoxaline (abbreviation: 2mDBTBPDBq-II), 2-[3'-(9H-carbazol-9-yl)biphenyl-3-yl]dibenzo[f,h]quinoxaline (abbreviation: 2mCzBPDBq), 4,6-bis[3-(phenanthren-9-yl)phenyl]pyrimidine (abbreviation: 4,6mPnP2Pm), and 4,6-bis[3-(4-dibenzothienyl)phenyl]pyrimidine (abbreviation: 4,6mDBTP2Pm-II); and heterocyclic compounds (e.g., a pyridine derivative, a quinoline derivative, and a dibenzoquinoline derivative) having pyridine skeletons, such as 3,5-bis[3-(9H-carbazol-9-yl)phenyl]pyridine (abbreviation: 35DCzPPy) and 1,3,5-tri[3-(3-pyridyl)phenyl]benzene (abbreviation: TmPyPB). Among the materials given above, the heterocyclic compound having a diazine skeleton and the heterocyclic compound having a pyridine skeleton have high reliability and are thus preferable. Specifically, the heterocyclic compound having a diazine (pyrimidine or pyrazine) skeleton has a high electron-transport property to contribute to a reduction in driving voltage. Among the materials given above, the heterocyclic compound having a diazine skeleton and the heterocyclic compound having a pyridine skeleton have high reliability and are thus preferable. Specifically, the heterocyclic compound having a diazine (pyrimidine or pyrazine) skeleton has a high electron-transport property to contribute to a reduction in drive voltage.

The organic material of one embodiment of the present invention can be used as a host material in the light-emitting layer 113. The organic material of one embodiment of the present invention is used as the host material in the light-emitting layer 113, so that an impurity in the organic material can be reduced and a highly reliable light-emitting element can be manufactured.

As the hole-transport material that can be used as an assist material in the light-emitting layer 113, any of the substances having high hole-transport properties that can be used for the hole-injection layer 111 and the hole-transport layer 112 may be used.

Note that it is preferable that these electron-transport materials and hole-transport materials do not have an absorption spectrum in the blue wavelength range. Specifically, an absorption edge of the absorption spectrum is preferably at 440 nm or less.

Examples of the light-emitting material for the light-emitting layer 113, which converts triplet-excitation energy into light emission, include a phosphorescent material and a thermally activated delayed fluorescence (TADF) material exhibiting thermally activated delayed fluorescence.

As the phosphorescent material, for example, a phosphorescent material having an emission peak at 440 nm to 520 nm is given, examples of which include organometallic iridium complexes having 4H-triazole skeletons, such as tris{2-[5-(2-methylphenyl)-4-(2,6-dimethylphenyl)-4H-1,2,4-triazol-3-yl-κN$^2$]phenyl-κC}iridium(III) (abbreviation: Ir(mpptz-dmp)$_3$), tris(5-methyl-3,4-diphenyl-4H-1,2,4-triazolato)iridium(III) (abbreviation: Ir(Mptz)$_3$, and tris[4-(3-biphenyl)-5-isopropyl-3-phenyl-4H-1,2,4-triazolato]iridium (III) (abbreviation: Ir(iPrptz-3b)$_3$); organometallic iridium complexes having 1H-triazole skeletons, such as tris[3-methyl-1-(2-methylphenyl)-5-phenyl-1H-1,2,4-triazolato]iridium(III) (abbreviation: Ir(Mptz1-mp)$_3$) and tris(1-methyl-5-phenyl-3-propyl-1H-1,2,4-triazolato)iridium(III) (abbreviation: Ir(Prptzl-Me)$_3$); organometallic iridium complexes having imidazole skeletons, such as fac-tris[1-(2,6-diisopropylphenyl)-2-phenyl-1H-imidazole]iridium(III) (abbreviation: Ir(iPrpmi)$_3$) and tris[3-(2,6-dimethylphenyl)-7-methylimidazo[1,2-f]phenanthridinato]iridium(III) (abbreviation: Ir(dmpimpt-Me)$_3$); and organometallic iridium complexes in which a phenylpyridine derivative having an electron-withdrawing group is a ligand, such as bis[2-(4',6'-difluorophenyl)pyridinato-N,C$^{2'}$]iridium(III) tetrakis(1-pyrazolyl)borate (abbreviation: FIr6), bis[2-(4',6'-difluorophenyl)pyridinato-N,C$^{2'}$]iridium(III) picolinate (abbreviation: FIrpic), bis{2-[3',5'-bis(trifluoromethyl)phenyl]pyridinato-N,C$^{2'}$}iridium(III) picolinate (abbreviation: Ir(CF$_3$ppy)$_2$(pic)), and bis[2-(4',6'-difluorophenyl)pyridinato-N,C$^{2'}$]iridium(III) acetylacetonate (abbreviation: FIr(acac)). Among the materials given above, the organometallic iridium complex having a 4H-triazole skeleton has high reliability and high emission efficiency and is thus especially preferable.

Examples of the phosphorescent material having an emission peak at 520 nm to 600 mu include organometallic iridium complexes having pyrimidine skeletons, such as tris(4-methyl-6-phenylpyrimidinato)iridium(III) (abbreviation: Ir(mppm)$_3$), tris(4-t-butyl-6-phenylpyrimidinato)iridium(III) (abbreviation: Ir(tBuppm)$_3$), (acetylacetonato)bis(6-methyl-4-phenylpyrimidinato)iridium(III) (abbreviation: Ir(mppm)$_2$(acac)), (acetylacetonato)bis(6-tert-butyl-4-phenylpyrimidinato)iridium(III) (abbreviation: Ir(tBuppm)$_2$(acac)), (acetylacetonato)bis[4-(2-norbornyl)-6-phenylpyrimidinato]iridium(III) (endo- and exo-mixture) (abbreviation: Ir(nbppm)$_2$(acac)), (acetylacetonato)bis[5-methyl-6-(2-methylphenyl)-4-phenylpyrimidinato]iridium(III) (abbreviation: Ir(mpmppm)$_2$(acac)), and (acetylacetonato)bis(4,6-diphenylpyrimidinato)iridium(III) (abbreviation: Ir(dppm)$_2$(acac)); organometallic iridium complexes having pyrazine skeletons, such as (acetylacetonato)bis(3,5-dimethyl-2-phenylpyrazinato)iridium(III) (abbreviation: Ir(mppr-Me)$_2$(acac)) and (acetylacetonato)bis(5-isopropyl-3-methyl-2-phenylpyrazinato)iridium(III) (abbreviation: Ir(mppr-iPr)$_2$(acac)); organometallic iridium complexes having pyridine skeletons, such as tris(2-phenylpyridinato-N,C$^{2'}$)iridium(III) (abbreviation: Ir(ppy)$_3$), bis(2-phenylpyridinato-N,C$^{2'}$)iridium(III) acetylacetonate (abbreviation: Ir(ppy)$_2$acac), bis(benzo[h]quinolinato)iridium(III) acetylacetonate (abbreviation: Ir(bzq)$_2$(acac)), tris(benzo[h]quinolinato)iridium(III) (abbreviation: Ir(bzq)$_3$), tris(2-phenylquinolinato-N,C$^{2'}$)iridium(III) (abbreviation: Ir(pq)$_3$, and bis(2-phenylquinolinato-N,C$^{2'}$)iridium(III) acetylacetonate (abbreviation: Ir(pq)$_2$(acac)); and a rare earth metal complex such as tris(acetylacetonato) (monophenanthroline)terbium(III) (abbreviation: Tb(acac)$_3$(Phen)). Among the materials given above, the organometallic iridium complex having a pyrimidine skeleton has distinctively high reliability and emission efficiency and is thus especially preferable.

Examples of the phosphorescent material having an emission peak at 600 nm to 700 nm include organometallic iridium complexes having pyrimidine skeletons, such as bis[4,6-bis(3-methylphenyl)pyrimidinato](diisobutylylmethano)iridium(III) (abbreviation: Ir(5mdppm)$_2$(dibm)), bis[4,6-bis(3-methylphenyl)pyrimidinato] (dipivaloylmethanato)iridium (III) (abbreviation: Ir(5mdppm)$_2$(dpm)), and bis[4,6-di (naphthalen-1-yl)pyrimidinato](dipivaloylmethanato) iridium(III) (abbreviation: Ir(d1npm)$_2$(dpm)); organometallic iridium complexes having pyrazine skeletons, such as (acetylacetonato)bis(2,3,5-triphenylpyrazinato)iridium(III) (abbreviation: Ir(tppr)$_2$(acac)), bis(2,3,5-triphenylpyrazinato) (dipivaloylmethanato)iridium(III) (abbreviation: Ir(tppr)$_2$(dpm)), or (acetylacetonato)bis[2,3-bis(4-fluorophenyl)quinoxalinato]iridium(III) (abbreviation: Ir(Fdpq)$_2$(acac)); organometallic iridium complexes having pyridine skeletons, such as tris(1-phenylisoquinolinato-N,C$^{2'}$)iridium(III) (abbreviation: Ir(piq)$_3$) and bis(1-phenylisoquinolinato-N,C$^{2'}$)iridium(III)acetylacetonate (abbreviation: Ir(piq)$_2$acac); a platinum complex such as 2,3,7,8,12,13,17,18-octaethyl-21H,23H-porphyrin platinum(II) (abbreviation: PtOEP); and rare earth metal complexes such as tris(1,3-diphenyl-1,3-propanedionato)(monophenanthroline) europium(III) (abbreviation: Eu(DBM)$_3$(Phen)) and tris[1-(2-thenoyl)-3,3,3-trifluoroacetonato](monophenanthroline) europium(III) (abbreviation: Eu(TTA)$_3$(Phen)).

The electron-transport layer 114 is a layer including a substance having a high electron-transport property. For the electron-transport layer 114, in addition to the electron-transport materials given above, a metal complex such as tris(8-quinolinolato)aluminum (abbreviation: Alq$_3$), tris(4-methyl-8-quinolinolato)aluminum (abbreviation: Almq$_3$), bis(10-hydroxybenzo[h]quinolinato)beryllium (abbreviation: BeBq$_2$), BAlq, Zn(BOX)$_2$, or bis[2-(2-hydroxyphenyl)benzothiazolato]zinc (abbreviation: Zn(BTZ)$_2$) can be used. A heteroaromatic compound such as 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 3-(4-tert-butylphenyl)-4-phenyl-5-(4-biphenylyl)-1,2,4-triazole (abbreviation: TAZ), 3-(4-tert-butylphenyl)-4-(4-ethylphenyl)-5-(4-biphenylyl)-1,2,4-triazole (abbreviation: p-EtTAZ), bathophenanthroline (abbreviation: BPhen), bathocuproine (abbreviation: BCP), or 4,4'-bis(5-methylbenzoxazol-2-yl)stilbene (abbreviation: BzOs) can also be used. A high molecular compound such as poly(2,5-pyridinediyl) (abbreviation: PPy), poly[(9,9-dihexylfluorene-2,7-diyl)-co-(pyridine-3,5-diyl)] (abbreviation: PF-Py) or poly[(9,9-dioctylfluorene-2,7-diyl)-co-(2,2'-bipyridine-6,6'-diyl)] (abbreviation: PF-BPy) can also be used. The substances given here are mainly ones that have an electron mobility of $10^{-6}$ cm$^2$/Vs or higher. Note that any substance other than the above substances may be used for the electron-transport layer 114 as long as the electron-transport property thereof is higher than the hole-transport property thereof.

The electron-transport layer 114 is not limited to a single layer, but may be a stack of two or more layers including any of the above substances.

The electron-injection layer 115 is a layer including a substance having a high electron-injection property. For the electron-injection layer 115, a compound of an alkali metal or an alkaline earth metal, such as lithium fluoride (LiF), cesium fluoride (CsF), calcium fluoride (CaF$_2$), or lithium oxide (LiO$_x$), can be used. A rare earth metal compound such as erbium fluoride (ErF$_3$) can also be used. Any of the substances for forming the electron-transport layer 114, which are given above, can also be used.

A composite material in which an organic compound and an electron donor (donor) are mixed may also be used for the electron-injection layer 115. Such a composite material is excellent in an electron-injection property and an electron-transport property because the electron donor causes electron generation in the organic compound. In this case, the organic compound is preferably a material excellent in transporting the generated electrons. Specifically, for example, the substances for forming the electron-transport layer 114 (e.g., a metal complex and a heteroaromatic compound), which are described above, can be used. As the electron donor, a substance exhibiting an electron-donating property with respect to the organic compound may be used. Specifically, an alkali metal, an alkaline earth metal, and a rare earth metal are preferable, and lithium, cesium, magnesium, calcium, erbium, ytterbium, and the like can be given. Alkali metal oxides or alkaline earth metal oxides are also preferable, and examples thereof include lithium oxide, calcium oxide, and barium oxide. A Lewis base such as magnesium oxide can also be used. An organic compound such as tetrathiafulvalene (abbreviation: TTF) can also be used.

Note that each of the above-described hole-injection layer 111, hole-transport layer 112, light-emitting layer 113, electron-transport layer 114, and electron-injection layer 115 can be formed by a method such as an evaporation method (e.g., a vacuum evaporation method), an inkjet method, or a coating method.

In the above light-emitting element, current flows due to a potential difference between the first electrode 101 and the second electrode 103 and holes and electrons recombine in the EL layer 102, so that light is emitted. Then, the emitted light is extracted to the outside through one or both of the first electrode 101 and the second electrode 103. Therefore, one or both of the first electrode 101 and the second electrode 103 are electrodes having a light-transmitting property.

Note that the structure described in this embodiment can be combined as appropriate with any of the structures described in the other embodiments.

(Embodiment 3)

In this embodiment, a light-emitting element in which the organic material of one embodiment of the present invention is used in a light-emitting layer, which is different from the light-emitting element described in Embodiment 2, will be described with reference to FIGS. 2A and 2B.

Figure 2A:
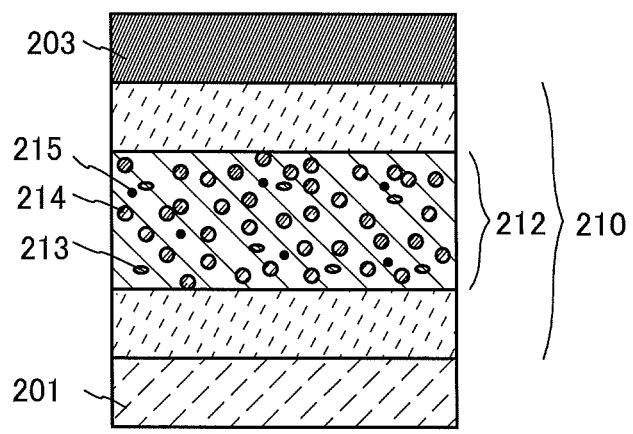
FIGS. 2A and 2B illustrate a light-emitting element of one embodiment of the present invention.
Figure 2B:
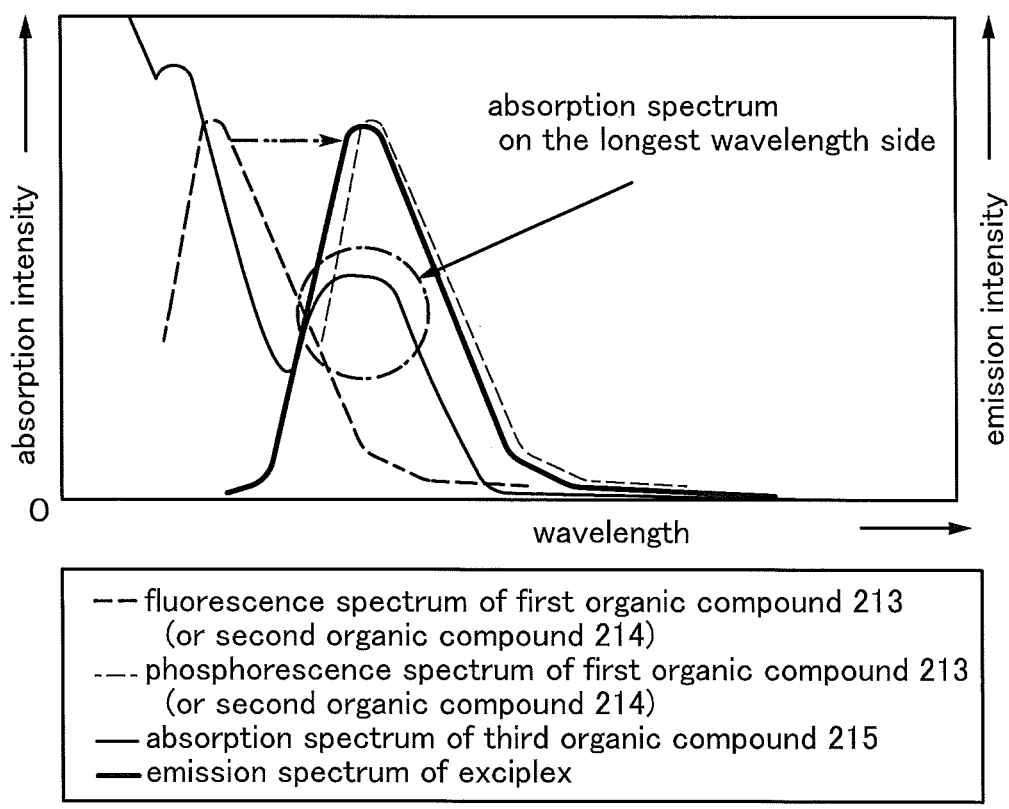

A light-emitting element described in this embodiment includes an EL layer 210 between a pair of electrodes (a first electrode 201 and a second electrode 203) as illustrated in FIG. 2A. Note that the EL layer 210 includes at least a light-emitting layer 212 and may further include a hole-injection layer, an electron-transport layer, an electron-injection layer, and the like. The substances given in Embodiment 2 can be used for the hole-injection layer, the electron-transport layer, the electron-injection layer, and the electron-injection layer. In this embodiment, the first electrode 201 is used as an anode and the second electrode 203 is used as a cathode.

The organic material of one embodiment of the present invention is included in the EL layer 210 described in this embodiment.

The light-emitting layer 212 includes a first organic compound 213, a second organic compound 214, and a third organic compound 215. In this embodiment, the first organic compound 213, the second organic compound 214, and the third organic compound 215 are used as a host material, an assist material, and a guest material, respectively. The organic material of one embodiment of the present invention can be applied, for example, to the first organic compound 213 used as a host material or the second organic compound 214 used as an assist material.

When the light-emitting layer 212 has a structure in which the guest material is dispersed in the host material, the crystallization of the light-emitting layer can be suppressed. Further, it is possible to suppress concentration quenching due to high concentration of the guest material, so that the light-emitting element can have high emission efficiency.

Note that it is preferable that a triplet excitation energy level ($T_1$ level) of each of the first organic compound 213 (host material) and the second organic compound 214 (assist material) be higher than that of the third organic compound 215 (guest material). The reason is as follows: when the $T_1$ level of the first organic compound 213 (or the second organic compound 214) is lower than that of the third organic compound 215, the triplet excitation energy of the third organic compound 215, which contributes to light emission, is quenched by the first organic compound 213 (or the second organic compound 214) and the emission efficiency decreases accordingly.

Here, for improvement in efficiency of energy transfer from a host material to a guest material, Förster mechanism (dipole-dipole interaction) and Dexter mechanism (electron exchange interaction), which are known as mechanisms of energy transfer between molecules, are considered. According to the mechanisms, it is preferable that an emission spectrum of a host material (fluorescence spectrum in energy transfer from a singlet excited state, phosphorescence spectrum in energy transfer from a triplet excited state) largely overlap with an absorption spectrum of a guest material (specifically, spectrum in an absorption band on the longest wavelength (lowest energy) side). However, in general, it is difficult to obtain an overlap between a fluorescence spectrum of a host material and an absorption spectrum in an absorption band on the longest wavelength (lowest energy) side of a guest material. The reason for this is as follows: if the fluorescence spectrum of the host material overlaps with the absorption spectrum in the absorption band on the longest wavelength (lowest energy) side of the guest material, since a phosphorescence spectrum of the host material is located on a longer wavelength (lower energy) side as compared to the fluorescence spectrum, the $T_1$ level of the host material becomes lower than the $T_1$ level of the phosphorescent compound and the above-described problem of quenching occurs; yet, when the host material is designed in such a manner that the $T_1$ level of the host material is higher than the $T_1$ level of the phosphorescent compound to avoid the problem of quenching, the fluorescence spectrum of the host material is shifted to the shorter wavelength (higher energy) side; thus, the fluorescence spectrum does not have any overlap with the absorption spectrum in the absorption band on the longest wavelength (lowest energy) side of the guest material. For that reason, in general, it is difficult to obtain an overlap between a fluorescence spectrum of a host material and an absorption spectrum in an absorption band on the longest wavelength (lowest energy) side of a guest material so as to maximize energy transfer from a singlet excited state of a host material.

Thus, in this embodiment, a combination of the first organic compound 213 and the second organic compound 214 preferably forms an excited complex (also referred to as exciplex). Thus, in the light-emitting layer 212, a fluorescence spectrum of the first organic compound 213 and that of the second organic compound 214 are converted into an emission spectrum of the exciplex which is located on the longer wavelength side. Moreover, when the first organic compound 213 and the second organic compound 214 are selected in such a manner that the emission spectrum of the exciplex largely overlaps with the absorption spectrum of the guest material (the third organic compound 215), energy transfer from a singlet excited state can be maximized (see FIG. 2B).

Note that also in the case of a triplet excited state, energy transfer from the exciplex, not the host material, is assumed to occur.

Any of the electron-transport materials given in Embodiment 2 or the organic material of one embodiment of the present invention is preferably used as the first organic compound 213. Any of the hole-transport materials given in Embodiment 2 is preferably used as the second organic compound 214. Any of the phosphorescent materials given in Embodiment 2 is preferably used as the third organic compound 215.

The above combination of the first organic compound 213 and the second organic compound 214 is an example of the combination which enables an exciplex to be formed. The combination is determined so that the emission spectrum of the exciplex overlaps with the absorption spectrum of the third organic compound 215 and that the peak of the emission spectrum of the exciplex has a longer wavelength than the peak of the absorption spectrum of the third organic compound 215.

Note that the electron-transport material and the hole-transport material are used as the first organic compound 213 and the second organic compound 214, respectively; adjusting the mixture ratio thereof can control the carrier balance. Specifically, the ratio of the first organic compound to the second organic compound is preferably 1:9 to 9:1.

In the light-emitting element described in this embodiment, energy transfer efficiency can be improved owing to energy transfer utilizing an overlap between an emission spectrum of an exciplex and an absorption spectrum of a phosphorescent compound. Thus, high external quantum efficiency of the light-emitting element can be achieved.

Note that the structure described in this embodiment can be combined as appropriate with any of the structures described in the other embodiments.

(Embodiment 4)

In this embodiment, as one embodiment of the present invention, a light-emitting element (hereinafter referred to as tandem light-emitting element) in which a charge generation layer is provided between a plurality of light-emitting layers will be described.

Figure 3A:
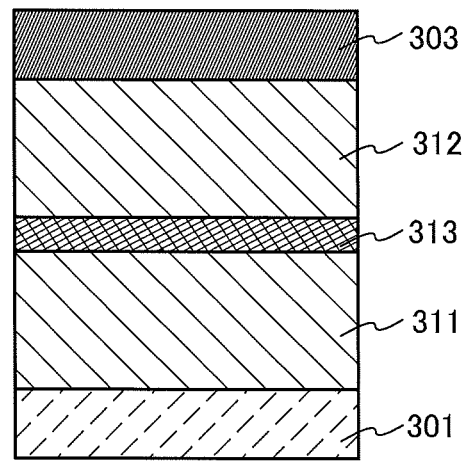
FIGS. 3A and 3B each illustrate a light-emitting element of one embodiment of the present invention.

A light-emitting element described in this embodiment is a tandem light-emitting element including a plurality of light-emitting layers (a first light-emitting layer 311 and a second light-emitting layer 312) between a pair of electrodes (a first electrode 301 and a second electrode 303) as illustrated in FIG. 3A.

In this embodiment, the first electrode 301 functions as an anode and the second electrode 303 functions as a cathode. Note that the first electrode 301 and the second electrode 303 can have structures similar to the structures described in Embodiment 2. In addition, although the plurality of light-emitting layers (the first light-emitting layer 311 and the second light-emitting layer 312) may have structures similar to the structure described in Embodiment 2 or 3, any of the light-emitting layers may have a structure similar to the structure described in Embodiment 2 or 3. In other words, the structures of the first light-emitting layer 311 and the second light-emitting layer 312 may be the same or different from each other and can be similar to the structure described in Embodiment 2 or 3.

Further, a charge generation layer 313 is provided between the plurality of light-emitting layers (the first light-emitting layer 311 and the second light-emitting layer 312). The charge generation layer 313 has a function of injecting electrons into one of the light-emitting layers and a function of injecting holes into the other of the light-emitting layers when voltage is applied between the first electrode 301 and the second electrode 303. In this embodiment, when voltage is applied such that the potential of the first electrode 301 is higher than that of the second electrode 303, the charge generation layer 313 injects electrons into the first light-emitting layer 311 and injects holes into the second light-emitting layer 312.

Note that in terms of light extraction efficiency, the charge generation layer 313 preferably has a property of transmitting visible light (specifically, the charge generation layer 313 has a visible light transmittance of 40% or higher). Further, the charge generation layer 313 functions even when it has lower conductivity than the first electrode 301 or the second electrode 303.

The charge generation layer 313 may have either a structure in which an electron acceptor (acceptor) is added to an organic compound having a high hole-transport property or a structure in which an electron donor (donor) is added to an organic compound having a high electron-transport property. Alternatively, both of these structures may be stacked.

In the case of the structure in which an electron acceptor is added to an organic compound having a high hole-transport property, as the organic compound having a high hole-transport property, for example, an aromatic amine compound such as NPB, TPD, TDATA, MTDATA, or 4,4'-bis[N-(spiro-9,9'-bifluoren-2-yl)-N-phenylamino]biphenyl (abbreviation: BSPB), or the like can be used. The substances given here are mainly ones that have a hole mobility of $10^{-6}$ cm$^2$/Vs or higher. Note that any substance other than the above substances may be used as long as the hole-transport property thereof is higher than the electron-transport property thereof.

Further, examples of the electron acceptor include 7,7,8,8-tetracyano-2,3,5,6-tetrafluoroquinodimethane (abbreviation: $F_4$-TCNQ), chloranil, and the like. Other examples include transition metal oxides. Other examples include oxides of metals belonging to Group 4 to Group 8 of the periodic table. Specifically, vanadium oxide, niobium oxide, tantalum oxide, chromium oxide, molybdenum oxide, tungsten oxide, manganese oxide, and rhenium oxide are preferable because of their high electron-accepting properties. Among these metal oxides, molybdenum oxide is especially preferable because it is stable in the air, has a low hygroscopic property, and is easily handled.

On the other hand, in the case of the structure in which an electron donor is added to an organic compound having a high electron-transport property, as the organic compound having a high electron-transport property for example, a metal complex having a quinoline skeleton or a benzoquinoline skeleton, such as Alq, Almq$_3$, BeBq$_2$, or BAlq, or the like can be used. Alternatively, a metal complex having an oxazole-based ligand or a thiazole-based ligand, such as Zn(BOX)$_2$ or Zn(BTZ)$_2$ can be used. Other than such a metal complex, PBD, OXD-7, TAZ, BPhen, BCP, or the like can be used. The substances given here are mainly ones that have an electron mobility of $10^{-6}$ cm$^2$/Vs or higher. Note that any substance other than the above substances may be used as long as the electron-transport property thereof is higher than the hole-transport property thereof.

Further, as the electron donor, an alkali metal, an alkaline earth metal, a rare earth metal, a metal belonging to Group 13 of the periodic table, or an oxide or carbonate thereof can be used. Specifically, lithium (Li), cesium (Cs), magnesium (Mg), calcium (Ca), ytterbium (Yb), indium (In), lithium oxide, cesium carbonate, or the like is preferably used. An organic compound such as tetrathianaphthacene may also be used as the electron donor.

The organic material of one embodiment of the present invention can be applied to the charge generation layer 313. Since an impurity in the organic material of one embodiment of the present invention is reduced, a light-emitting element with high reliability can be manufactured.

By forming the charge generation layer 313 with any of the above materials, it is possible to suppress an increase in driving voltage caused when the light-emitting layers are stacked.

Figure 3B:
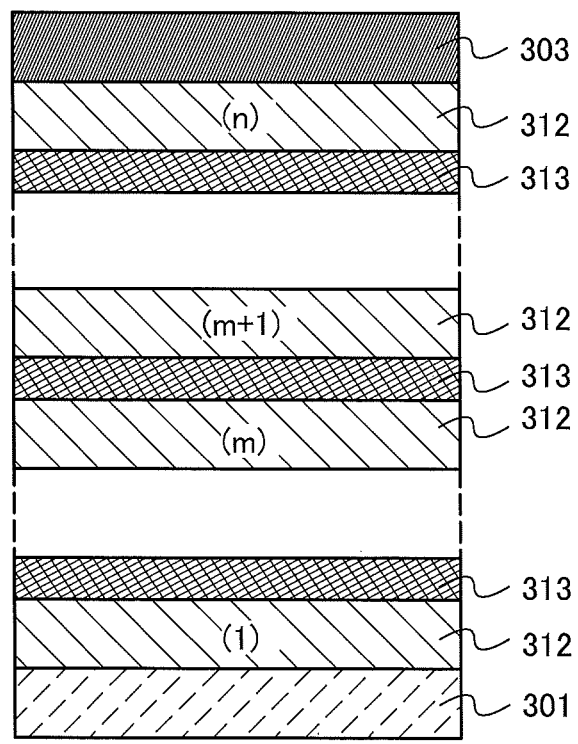

Although FIG. 3A illustrates the light-emitting element including two light-emitting layers, the present invention can be similarly applied to a light-emitting element in which n light-emitting layers (n is three or more) are stacked as illustrated in FIG. 3B. In the case where a plurality of light-emitting layers are provided between a pair of electrodes as in the light-emitting element of this embodiment, by providing a charge generation layer 313 between the light-emitting layers, the light-emitting element can emit light in a high luminance region while the current density is kept low. Since the current density can be kept low, the element can have a long lifetime. When the light-emitting element is applied to lighting, voltage drop due to resistance of an electrode material can be reduced, thereby achieving homogeneous light emission in a large area. Moreover, it is possible to achieve a light-emitting device which can be driven at low voltage and has low power consumption.

Further, by making emission colors of light-emitting layers different, light of a desired color can be obtained from the light-emitting element as a whole. For example, the emission colors of first and second light-emitting layers are complementary in a light-emitting element having the two light-emitting layers, so that the light-emitting element can be made to emit white light as a whole. Note that the term "complementary" means color relationship in which an achromatic color is obtained when colors are mixed. In other words, emission of white light can be obtained by mixture of light emitted from substances whose emission colors are complementary colors.

Further, the same applies to a light-emitting element having three light-emitting layers. For example, the light-emitting element as a whole can emit white light when the emission color of the first light-emitting layer is red, the emission color of the second light-emitting layer is green, and the emission color of the third light-emitting layer is blue.

Note that the structure described in this embodiment can be combined as appropriate with any of the structures described in the other embodiments.

(Embodiment 5)

In this embodiment, a light-emitting device that is one embodiment of the present invention will be described.

Figure 4:
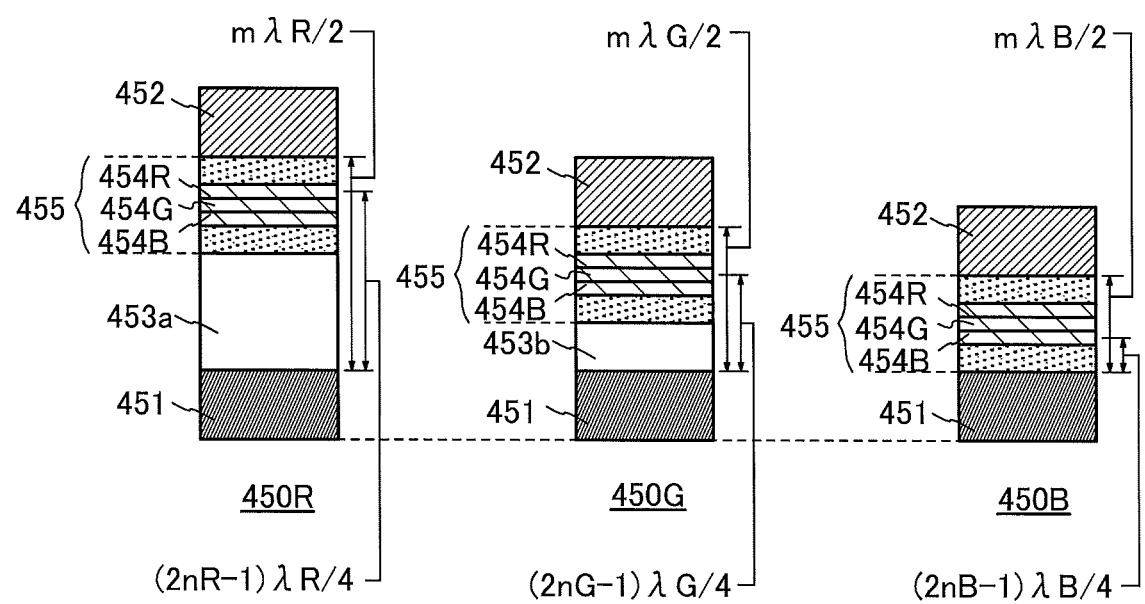
FIG. 4 illustrates light-emitting elements and a light-emitting device of one embodiment of the present invention.

A light-emitting device described in this embodiment has a micro optical resonator (microcavity) structure in which a light resonant effect between a pair of electrodes is utilized. The light-emitting device includes, as illustrated in FIG. 4, a plurality of light-emitting elements each of which has at least an EL layer 455 between a pair of electrodes (a reflective electrode 451 and a semi-transmissive and semi-reflective electrode 452). Further, the EL layer 455 includes at least light-emitting layers 454 (454R, 454G and 454B), and may further include a hole-transport layer, a hole-injection layer, an electron-transport layer, an electron-injection layer, a charge generation layer, and the like.

The organic material of one embodiment of the present invention can be applied to the EL layer 455. The application of the organic material of one embodiment of the present invention to the EL layer 455 enables a light-emitting device with high reliability to be achieved.

A first light-emitting element 450R has a structure in which a first transparent conductive layer 453a, an EL layer 455 part of which includes a first light-emitting layer 454B, a second light-emitting layer 454G, and a third light-emitting layer 454R, and the semi-transmissive and semi-reflective electrode 452 are sequentially stacked over the reflective electrode 451. A second light-emitting element 450G has a structure in which a second transparent conductive layer 453b, the EL layer 455, and the semi-transmissive and semi-reflective electrode 452 are sequentially stacked over the reflective electrode 451. A third light-emitting element 450B has a structure in which the EL layer 455 and the semi-transmissive and semi-reflective electrode 452 are sequentially stacked over the reflective electrode 451.

Note that the reflective electrode 451, the EL layer 455, and the semi-transmissive and semi-reflective electrode 452 are common to the light-emitting elements (the first light-emitting element 450R, the second light-emitting element 450G, and the third light-emitting element 450B). The first light-emitting layer 454B emits light ($\lambda_B$) having a peak in a wavelength region from 420 nm to 480 nm. The second light-emitting layer 454G emits light ($\lambda_G$) having a peak in a wavelength region from 500 nm to 550 nm. The third light-emitting layer 454R emits light ($\lambda_R$) having a peak in a wavelength range from 600 nm to 760 nm. Thus, in each of the light-emitting elements (the first light-emitting element 450R, the second light-emitting element 450G, and the third light-emitting element 450B), the lights emitted from the first light-emitting layer 454B, the second light-emitting layer 454E and the third light-emitting layer 454R overlap with each other; accordingly, light having a broad emission spectrum that covers a visible light range can be emitted. Note that the above wavelengths satisfy the relation of $\lambda_B < \lambda_G < \lambda_R$.

Each of the light-emitting elements described in this embodiment has a structure in which the EL layer 455 is interposed between the reflective electrode 451 and the semi-transmissive and semi-reflective electrode 452. The lights emitted in all directions from the light-emitting layers included in the EL layer 455 are resonated by the reflective electrode 451 and the semi-transmissive and semi-reflective electrode 452 which function as a micro optical resonator (microcavity). Note that the reflective electrode 451 is formed using a conductive material having reflectivity, and a film whose visible light reflectivity is 40% to 100%, preferably 70% to 100%, and whose resistivity is $1 \times 10^{-2}$ Ωcm or lower is used. In addition, the semi-transmissive and semi-reflective electrode 452 is formed using a conductive material having reflectivity and a conductive material having a light-transmitting property, and a film whose visible light reflectivity is 20% to 80%, preferably 40% to 70%, and whose resistivity is $1 \times 10^{-2}$ Ωcm or lower is used.

In this embodiment, the thicknesses of the transparent conductive layers (the first transparent conductive layer 453a and the second transparent conductive layer 453b) provided in the first light-emitting element 450R and the second light-emitting element 450G respectively, are varied between the light-emitting elements, whereby the light-emitting elements differ in the optical path length from the reflective electrode 451 to the semi-transmissive and semi-reflective electrode 452. In other words, in light having a broad emission spectrum, which is emitted from the light-emitting layers of each of the light-emitting elements, light with a wavelength that is resonated between the reflective electrode 451 and the semi-transmissive and semi-reflective electrode 452 can be enhanced while light with a wavelength that is not resonated therebetween can be attenuated. Thus, when the elements differ in the optical path length from the reflective electrode 451 to the semi-transmissive and semi-reflective electrode 452, light with different wavelengths can be extracted.

Note that the optical path length (also referred to as optical distance) is expressed as a product of an actual distance and a refractive index. In this embodiment, the optical path length is a product of an actual thickness and n (refractive index); that is, optical path length=actual thickness×n.

Further, the optical path length from the reflective electrode 451 to the semi-transmissive and semi-reflective electrode 452 is set to $m\lambda_R/2$ (m is a natural number of 1 or more) in the first light-emitting element 450R; the optical path length from the reflective electrode 451 to the semi-transmissive and semi-reflective electrode 452 is set to $m\lambda_G/2$ (m is a natural number of 1 or more) in the second light-emitting element 450G; and the optical path length from the reflective electrode 451 to the semi-transmissive and semi-reflective electrode 452 is set to $m\lambda_B/2$ (m is a natural number of 1 or more) in the third light-emitting element 450B.

In this manner, the light ($\lambda_R$) emitted from the third light-emitting layer 454R included in the EL layer 455 is mainly extracted from the first light-emitting element 450R, the light ($\lambda_G$) emitted from the second light-emitting layer 454G included in the EL layer 455 is mainly extracted from the second light-emitting element 450E and the light ($\lambda_B$) emitted from the first light-emitting layer 454B included in the EL layer 455 is mainly extracted from the third light-emitting element 450B. Note that the light extracted from each of the light-emitting elements is emitted through the semi-transmissive and semi-reflective electrode 452 side.

Further, strictly speaking, the optical path length from the reflective electrode 451 to the semi-transmissive and semi-reflective electrode 452 is the distance from a reflection region in the reflective electrode 451 to a reflection region in the semi-transmissive and semi-reflective electrode 452. However, it is difficult to precisely determine the positions of the reflection regions in the reflective electrode 451 and the semi-transmissive and semi-reflective electrode 452; therefore, it is assumed that the above effect can be sufficiently obtained wherever the reflection regions may be set in the reflective electrode 451 and the semi-transmissive and semi-reflective electrode 452.

Next, the optical path length from the reflective electrode 451 to the third light-emitting layer 454R is adjusted to $(2n_R - 1)\lambda_R/4$ ($n_R$ is a natural number of 1 or more) because in the first light-emitting element 450R, light (first reflected light) that is reflected by the reflective electrode 451 of the light emitted from the third light-emitting layer 454R interferes with light (first incident light) that directly enters the semi-transmissive and semi-reflective electrode 452 from the third light-emitting layer 454R. By adjusting the optical path length, the phases of the first reflected light and the first incident light can be aligned with each other and the light emitted from the third light-emitting layer 454R can be amplified.

Note that, strictly speaking, the optical path length from the reflective electrode 451 to the third light-emitting layer 454R can be the optical path length from a reflection region in the reflective electrode 451 to a light-emitting region in the third light-emitting layer 454R. However, it is difficult to precisely determine the positions of the reflection region in the reflective electrode 451 and the light-emitting region in the third light-emitting layer 454R; therefore, it is assumed that the above effect can be sufficiently obtained wherever the reflection region and the light-emitting region may be set in the reflective electrode 451 and the third light-emitting layer 454R, respectively.

Next, the optical path length from the reflective electrode 451 to the second light-emitting layer 454G is adjusted to $(2n_G-1)\lambda_G/4$ ($n_G$ is a natural number of 1 or more) because in the second light-emitting element 450G light (second reflected light) that is reflected by the reflective electrode 451 of the light emitted from the second light-emitting layer 454G interferes with light (second incident light) that directly enters the semi-transmissive and semi-reflective electrode 452 from the second light-emitting layer 454G. By adjusting the optical path length, the phases of the second reflected light and the second incident light can be aligned with each other and the light emitted from the second light-emitting layer 454G can be amplified.

Note that, strictly speaking, the optical path length from the reflective electrode 451 to the second light-emitting layer 454G can be the optical path length from a reflection region in the reflective electrode 451 to a light-emitting region in the second light-emitting layer 454G. However, it is difficult to precisely determine the positions of the reflection region in the reflective electrode 451 and the light-emitting region in the second light-emitting layer 454G; therefore, it is assumed that the above effect can be sufficiently obtained wherever the reflection region and the light-emitting region may be set in the reflective electrode 451 and the second light-emitting layer 454G, respectively.

Next, the optical path length from the reflective electrode 451 to the first light-emitting layer 454B is adjusted to $(2n_B - 1)\lambda_B/4$ ($n_B$ is a natural number of 1 or more) because in the third light-emitting element 450B, light (third reflected light) that is reflected by the reflective electrode 451 of the light emitted from the first light-emitting layer 454B interferes with light (third incident light) that directly enters the semi-transmissive and semi-reflective electrode 452 from the first light-emitting layer 454B. By adjusting the optical path length, the phases of the third reflected light and the third incident light can be aligned with each other and the light emitted from the first light-emitting layer 454B can be amplified.

Note that, strictly speaking, the optical path length from the reflective electrode 451 to the first light-emitting layer 454B can be the optical path length from a reflection region in the reflective electrode 451 to a light-emitting region in the first light-emitting layer 454B. However, it is difficult to precisely determine the positions of the reflection region in the reflective electrode 451 and the light-emitting region in the first light-emitting layer 454B; therefore, it is assumed that the above effect can be sufficiently obtained wherever the reflection region and the light-emitting region may be set in the reflective electrode 451 and the first light-emitting layer 454B, respectively.

Note that although each of the light-emitting elements in the above-described structures includes a plurality of light-emitting layers in the EL layer, the present invention is not limited thereto; for example, the structure of the tandem (stacked-type) light-emitting element which is described in Embodiment 4 can be combined, in which case a plurality of light-emitting layers are provided so that a charge generation layer is interposed therebetween in one light-emitting element.

The light-emitting device described in this embodiment has a microcavity structure, in which light with wavelengths which vary depending on the light-emitting elements can be extracted even when they include EL layers with the same structure, so that it is not necessary to form light-emitting elements for the colors of R, and B. Therefore, the above structure is advantageous for full color display owing to easiness in achieving higher resolution display or the like. In addition, emission intensity with a predetermined wavelength in the front direction can be increased, whereby power consumption can be reduced. The above structure is particularly useful in the case of being applied to a color display (image display device) including pixels of three or more colors but may also be applied to lighting or the like.

Note that the structure described in this embodiment can be combined as appropriate with any of the structures described in the other embodiments.

(Embodiment 6)

In this embodiment, a light-emitting device including a light-emitting element which is one embodiment of the present invention will be described.

The light-emitting device can be either a passive matrix light-emitting device or an active matrix light-emitting device. In this embodiment, an active matrix light-emitting device is described with reference to FIGS. 5A and 5B.

Figure 5A:
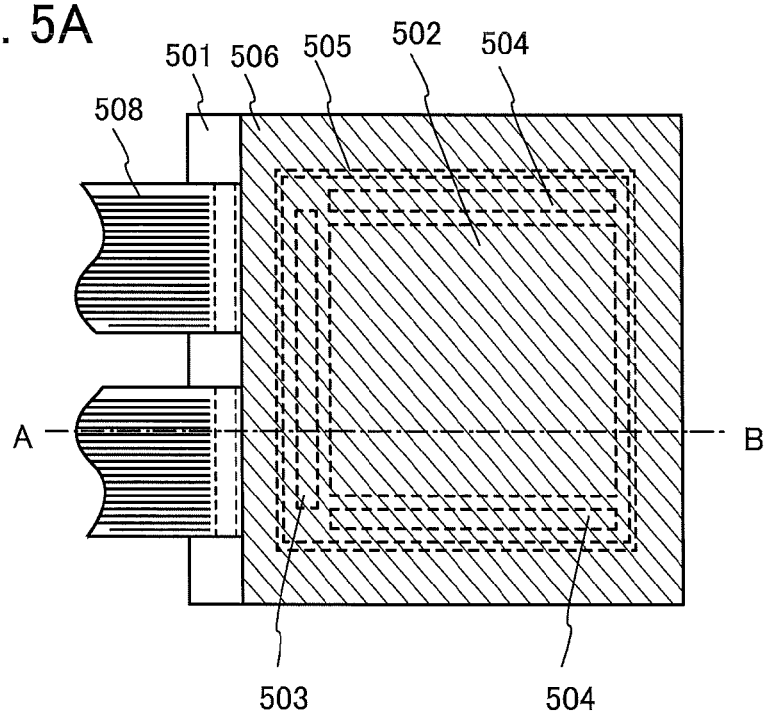
FIGS. 5A and 5B illustrate a light-emitting device of one embodiment of the present invention.
Figure 5B:
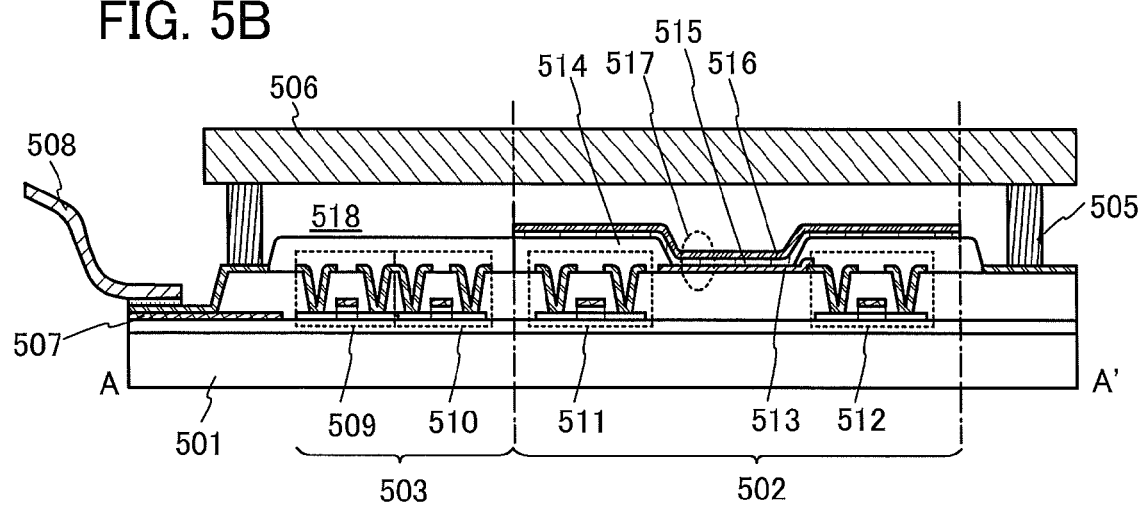

FIG. 5A is a top view illustrating a light-emitting device and FIG. 5B is a cross-sectional view taken along dashed line A-B in FIG. 5A. The active matrix light-emitting device of this embodiment includes a pixel portion 502 provided over an element substrate 501, a driver circuit portion (a source line driver circuit) 503, and driver circuit portions (gate line driver circuits) 504. The pixel portion 502, the driver circuit portion 503, and the driver circuit portion 504 are sealed with a sealant 505 between the element substrate 501 and a sealing substrate 506.

In addition, over the element substrate 501, a lead wiring 507 for connecting an external input terminal, through which a signal (e.g., a video signal, a clock signal, a start signal, a reset signal, or the like) or electric potential from the outside is transmitted to the driver circuit portion 503 and the driver circuit portion 504, is provided. Here, an example is described in which a flexible printed circuit (FPC) 508 is provided as the external input terminal. Although only the FPC is illustrated here, a printed wiring board (PWB) may be attached to the FPC. The light-emitting device in this specification includes, in its category, not only the light-emitting device itself but also the light-emitting device provided with the FPC or the PWB.

Next, a cross-sectional structure will be described with reference to FIG. 5B. The driver circuit portion and the pixel portion are formed over the element substrate 501; here are illustrated the driver circuit portion 503 which is the source line driver circuit and the pixel portion 502.

An example is illustrated in which a CMOS circuit which is a combination of an n-channel TFT 509 and a p-channel TFT 510 is formed as the driver circuit portion 503. Note that a circuit included in the driver circuit portion may be formed using any of various circuits, such as a CMOS circuit, a PMOS circuit, or an NMOS circuit. In this embodiment, although a driver-integrated type structure in which a driver circuit is formed over a substrate is described, a driver circuit is not necessarily formed over a substrate but can be formed outside a substrate.

The pixel portion 502 is formed of a plurality of pixels each of which includes a switching TFT 511, a current control TFT 512, and a first electrode 513 which is electrically connected to a wiring (a source electrode or a drain electrode) of the current control TFT 512. An insulator 514 is formed so as to cover an edge portion of the first electrode 513. In this embodiment, the insulator 514 is formed using a positive photosensitive acrylic resin. Note that the first electrode 513 is used as an anode in this embodiment.

In addition, in order to obtain favorable coverage by a film which is to be stacked over the insulator 514, the insulator 514 is preferably formed so as to have a curved surface with curvature at an upper edge portion or a lower edge portion. For example, in the case of using a positive photosensitive acrylic resin as a material for the insulator 514, the insulator 514 is preferably formed so as to have a curved surface with a curvature radius (0.2 μm to 3 μm) at the upper edge portion. The insulator 514 can be formed using either a negative photosensitive resin or a positive photosensitive resin. It is possible to use, without limitation to an organic compound, either an organic compound or an inorganic compound such as silicon oxide or silicon oxynitride.

An EL layer 515 and a second electrode 516 are stacked over the first electrode 513. The structure described in the above embodiment can be applied to the EL layer 515, and the organic material of one embodiment of the present invention can be used for the EL layer 515. Note that the first electrode 513 is used as an anode and a second electrode 516 is used as a cathode in this embodiment.

A light-emitting element 517 is formed of a stacked structure of the first electrode 513, the EL layer 515, and the second electrode 516. For each of the first electrode 513, the EL layer 515, and the second electrode 516, any of the materials described in Embodiment 2 can be used. Although not illustrated, the second electrode 516 is electrically connected to an FPC 508 which is an external input terminal.

Although the cross-sectional view of FIG. 5B illustrates only one light-emitting element 517, a plurality of light-emitting elements are arranged in matrix in the pixel portion 502. Light-emitting elements that emit light of three kinds of colors (R, G, and B) are selectively formed in the pixel portion 502, whereby a light-emitting device capable of full color display can be obtained. Alternatively, a light-emitting device capable of full color display may be manufactured by a combination with color filters.

Further, the sealing substrate 506 is attached to the element substrate 501 with the sealant 505, whereby a light-emitting element 517 is provided in a space 518 surrounded by the element substrate 501, the sealing substrate 506, and the sealant 505. Note that the space 518 may be filled with an inert gas (such as nitrogen and argon) or the sealant 505.

An epoxy-based resin is preferably used for the sealant 505. Such a material preferably allows as little moisture and oxygen as possible to penetrate. As the sealing substrate 506, a plastic substrate formed of fiberglass-reinforced plastics (FRP), polyvinyl fluoride (PVF), polyester, acrylic, or the like can be used besides a glass substrate or a quartz substrate.

As described above, an active matrix light-emitting device can be obtained.

Note that the structure described in this embodiment can be combined as appropriate with any of the structures described in the other embodiments.

(Embodiment 7)

In this embodiment, electronic appliances each of which includes the light-emitting device of one embodiment of the present invention described in the above embodiment will be described. Examples of the electronic appliance include cameras such as video cameras and digital cameras, goggle type displays, navigation systems, audio replay devices (e.g., car audio systems and audio systems), computers, game machines, portable information terminals (e.g., mobile computers, mobile phones, smartphones, portable game machines, e-book readers, and tablet terminals), and image replay devices in which a recording medium is provided (specifically, devices that are capable of replaying recording media such as digital versatile discs (DVDs) and equipped with a display device that can display an image). Specific examples of these electronic appliances will be described with reference to FIGS. 6A to 6D and FIGS. 7A to 7D.

Figure 6A:
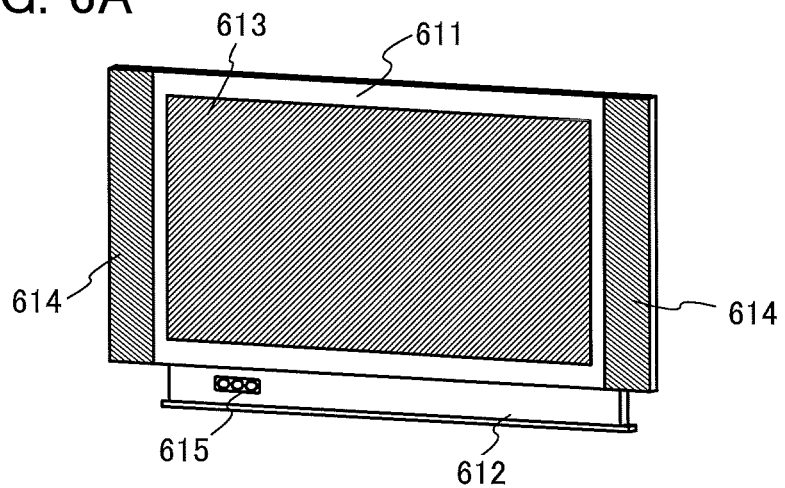
FIGS. 6A to 6D each illustrate an electronic appliance of one embodiment of the present invention.

FIG. 6A illustrates a television set of one embodiment of the present invention, which includes a housing 611, a supporting base 612, a display portion 613, speaker portions 614, video input terminals 615, and the like. In this television set, the light-emitting device of one embodiment of the present invention can be applied to the display portion 613. The light-emitting device of one embodiment of the present invention, which has high reliability and a long lifetime, is applied to a television set, so that the television set can have high reliability.

Figure 6B:
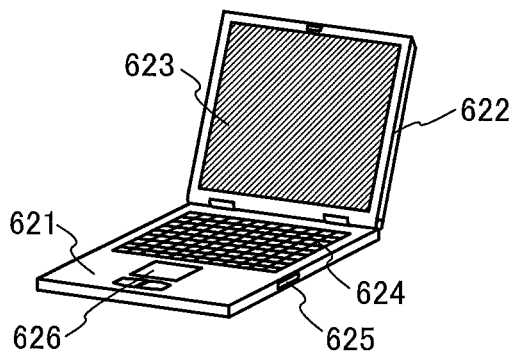

FIG. 6B illustrates a computer of one embodiment of the present invention, which includes a main body 621, a housing 622, a display portion 623, a keyboard 624, an external connection port 625, a pointing device 626, and the like. In this computer, the light-emitting device of one embodiment of the present invention can be applied to the display portion 623. The light-emitting device of one embodiment of the present invention, which has high reliability and a long lifetime, is applied to a computer, so that the computer can have high reliability.

Figure 6C:
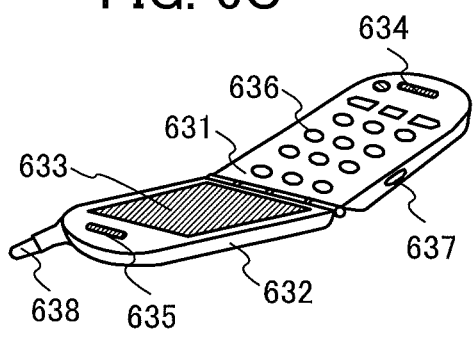

FIG. 6C illustrates a mobile phone of one embodiment of the present invention, which includes a main body 631, a housing 632, a display portion 633, an audio input portion 634, an audio output portion 635, operation keys 636, an external connection port 637, an antenna 638, and the like. In this mobile phone, the light-emitting device of one embodiment of the present invention can be applied to the display portion 633. The light-emitting device of one embodiment of the present invention, which has high reliability and a long lifetime, is applied to a mobile phone, so that the mobile phone can have high reliability.

Figure 6D:
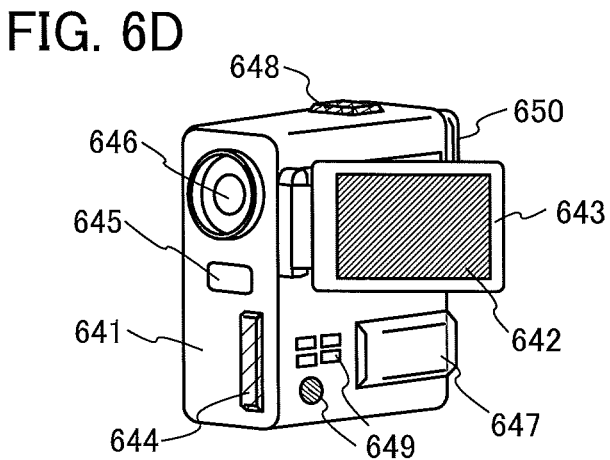

FIG. 6D illustrates a camera of one embodiment of the present invention, which includes a main body 641, a display portion 642, a housing 643, an external connection port 644, a remote control receiving portion 645, an image receiving portion 646, a battery 647, an audio input portion 648, operation keys 649, an eyepiece portion 650, and the like. In this camera, the light-emitting device of one embodiment of the present invention can be applied to the display portion 642. The light-emitting device of one embodiment of the present invention, which has high reliability and a long lifetime, is applied to a camera, so that the camera can have high reliability.

Figures 7A, 7B, 7C:
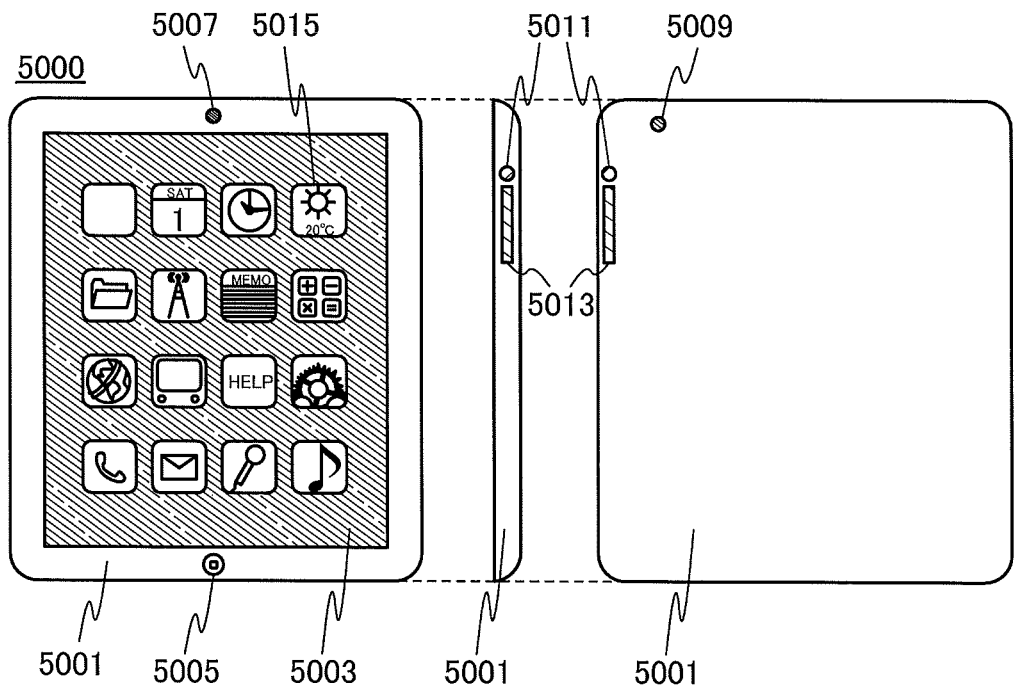
FIGS. 7A to 7D illustrate electronic appliances of one embodiment of the present invention.
Figure 7D:
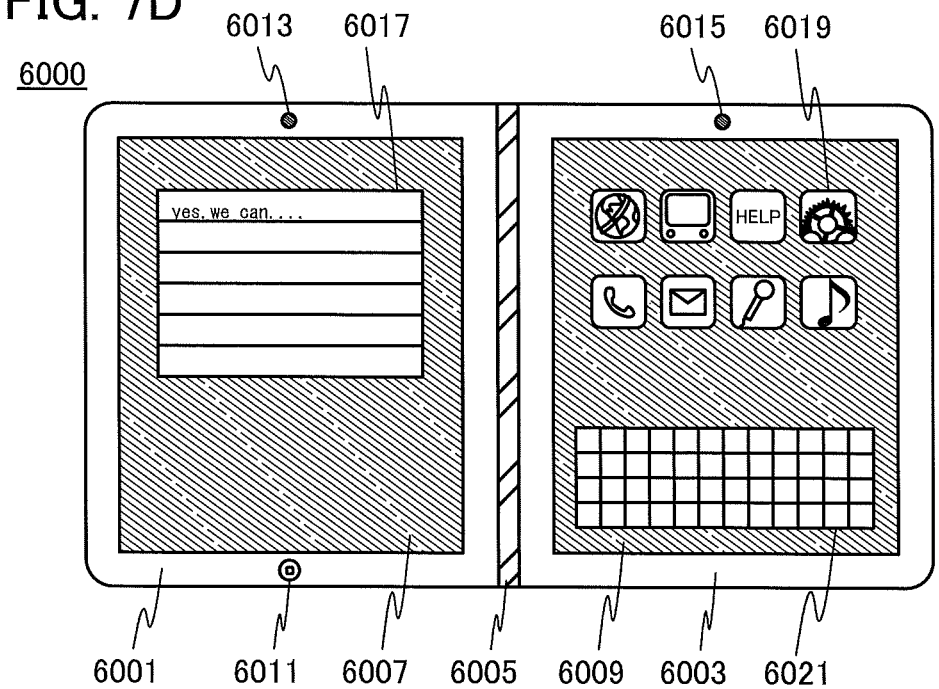

FIGS. 7A to 7D illustrate examples of portable terminals of one embodiment of the present invention. FIGS. 7A, 7B, and 7C illustrate a portable terminal 5000, and FIG. 7D illustrates a mobile terminal 6000.

FIGS. 7A, 7B, and 7C are a front view, a side view, and a rear view of the portable terminal 5000, respectively. FIG. 7D is a front view of the mobile terminal 6000.

The portable terminal 5000 includes a housing 5001, a display portion 5003, a power button 5005, a front camera 5007, a rear camera 5009, a first external connection terminal 5011, a second external connection terminal 5013, and the like.

In addition, the display portion 5003 is incorporated in the housing 5001 and can be used as a touch panel. For example, e-mailing or schedule management can be performed by touching an icon 5015 and the like on the display portion 5003. Further, the front camera 5007 is incorporated on the front side of the housing 5001, whereby an image on the user's side can be taken. The rear camera 5009 is incorporated in the rear side of the housing 5001, whereby an image on the opposite side of the user can be taken. Further, the housing 5001 includes the first external connection terminal 5011 and the second external connection terminal 5013. Sound can be output to an earphone or the like through the first external connection terminal 5011, and data can be moved through the second external connection terminal 5013, for example.

The portable terminal 6000 in FIG. 7D includes a first housing 6001, a second housing 6003, a hinge portion 6005, a first display portion 6007, a second display portion 6009, a power button 6011, a first camera 6013, a second camera 6015, and the like.

The first display portion 6007 is incorporated in the first housing 6001. The second display portion 6009 is incorporated in the second housing 6003. For example, the first display portion 6007 and the second display portion 6009 are used as a display panel and a touch panel, respectively. A user can select images, enter characters, and so on by touching an icon 6019 displayed on the second display portion 6009 or a keyboard 6021 (actually, a keyboard image displayed on the second display portion 6009) while looking at a text icon 6017 displayed on the first display portion 6007. Alternatively, the first display portion 6007 and the second display portion 6009 may be a touch panel and a display panel, respectively, or the first display portion 6007 and the second display portion 6009 may be touch panels.

The first housing 6001 and the second housing 6003 are connected to each other and open and close on the hinge portion 6005. In such a structure, the first display portion 6007 incorporated in the first housing 6001 and the second display portion 6009 incorporated in the second housing 6003 are preferably made to face each other in carrying the portable terminal 6000, in which case the surfaces of the first display portion 6007 and the second display portion 6009 (e.g., plastic substrates) can be protected.

Alternatively, the first housing 6001 and the second housing 6003 may be separated by the hinge portion 6005 (i.e., convertible type). Thus, the application range of the portable terminal 6000 can be extended, and for example, the first housing 6001 is placed vertically and the second housing 6003 is placed horizontally.

Further, the first camera 6013 and the second camera 6015 can take 3D images.

The portable terminal 5000 and the portable terminal 6000 may send and receive data wirelessly. For example, through wireless internet connection, desired data can be purchased and downloaded.

The portable terminal 5000 and the portable terminal 6000 can have other functions such as a function of displaying various kinds of data (e.g., a still image, a moving image, and a text image), a function of displaying a calendar, a date, the time, or the like on the display portion, a touch-input function of operating or editing the data displayed on the display portion by touch input, and a function of controlling processing by various kinds of software (programs). A detector such as a photodetector capable of optimizing display luminance in accordance with the amount of outside light or a sensor for detecting inclination, like a gyroscope or an acceleration sensor, may be included.

The light-emitting device of one embodiment of the present invention can be applied to the display portion 5003 of the portable terminal 5000 and the first display portion 6007 of the portable terminal 6000 and/or the second display portion 6009 of the portable terminal 6000. The light-emitting device of one embodiment of the present invention, which has high reliability and a long lifetime, is applied to a portable terminal, so that the portable terminal can have high reliability.

As described above, the applicable range of the light-emitting device of one embodiment of the present invention is so wide that the light-emitting device can be applied to electronic appliances in a variety of fields. With the use of the light-emitting device of one embodiment of the present invention, an electronic appliance which has high reliability and a long lifetime can be obtained.

The light-emitting device of one embodiment of the present invention can also be used as a lighting device. Specific examples of the lighting device are described with reference to FIGS. 8A to 8C.

Figure 8A:
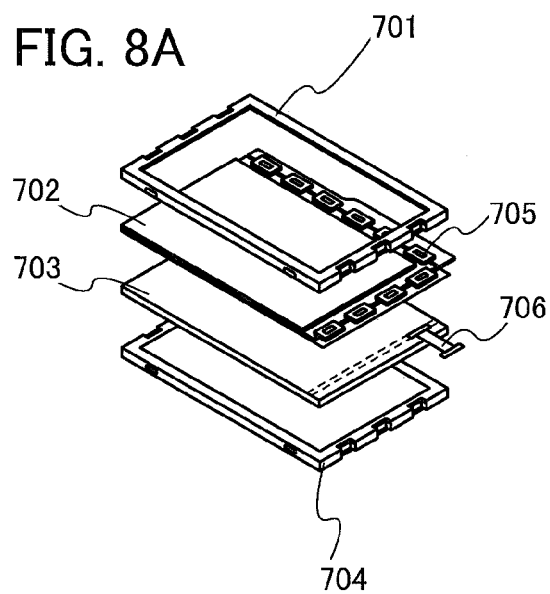
FIGS. 8A to 8C illustrate lighting devices and electronic appliances of one embodiment of the present invention.

FIG. 8A illustrates an example of a liquid crystal display device using the light-emitting device of one embodiment of the present invention as a backlight. The liquid crystal display device illustrated in FIG. 8A includes a housing 701, a liquid crystal panel 702, a backlight 703, and a housing 704. The liquid crystal panel 702 is connected to a driver IC 705. The light-emitting device of one embodiment of the present invention is used as the backlight 703, and current is supplied through a terminal 706. The light-emitting device of one embodiment of the present invention is used as the backlight of the liquid crystal display device as described above, so that the backlight can have high reliability and a long lifetime. Moreover, since the light-emitting device of one embodiment of the present invention is a lighting device for surface light emission and the enlargement of the light-emitting device is possible, the backlight can be made larger. Thus, a larger-area liquid crystal display device with low power consumption can be obtained.

Figure 8B:
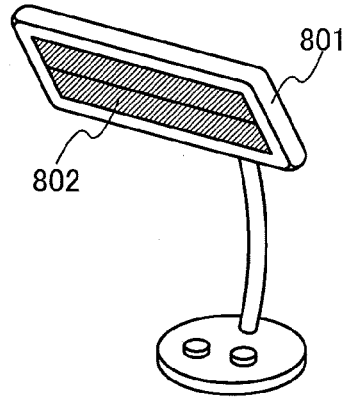

Next, FIG. 8B illustrates an example in which the light-emitting device of one embodiment of the present invention is used for a desk lamp which is a lighting device. The desk lamp illustrated in FIG. 8B includes a housing 801 and a light source 802, and the light-emitting device according to one embodiment of the present invention is used as the light source 802. The light-emitting device of one embodiment of the present invention is applied to a desk lamp, so that the desk lamp can have high reliability.

Figure 8C:
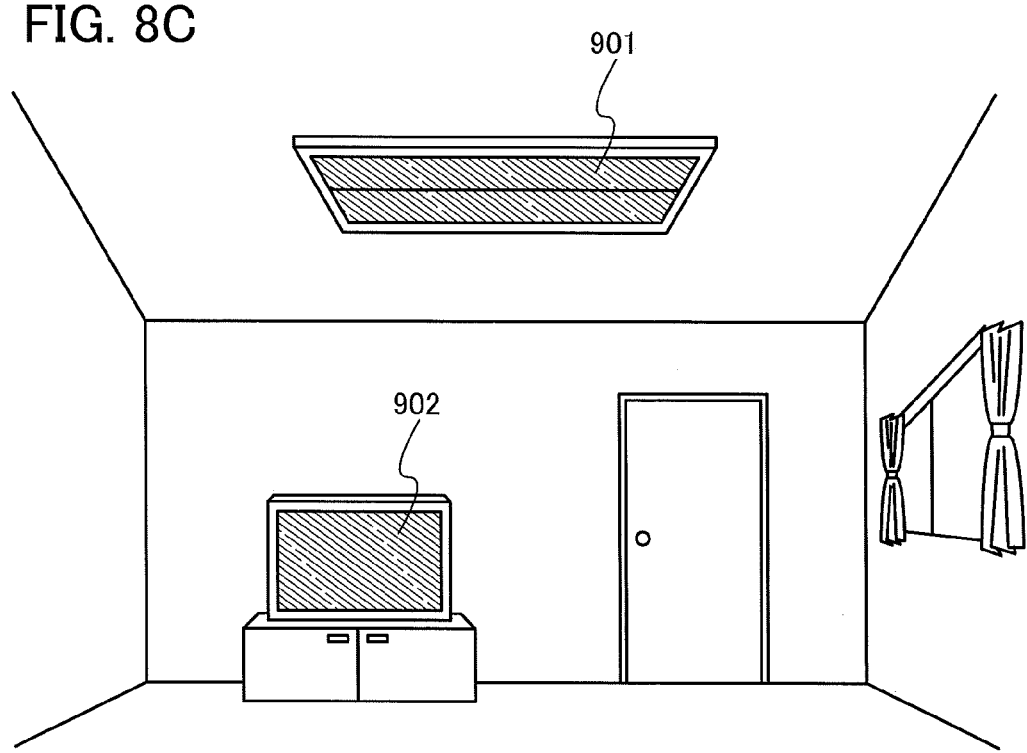

FIG. 8C illustrates an example in which the light-emitting device of one embodiment of the present invention is used for an indoor lighting device 901. Since the light-emitting device of one embodiment of the present invention can also have a larger area, the light-emitting device of one embodiment of the present invention can be used as a lighting device having a large area. Further, the light-emitting device of one embodiment of the present invention, which has high reliability and a long lifetime, is applied to a lighting device, so that the lighting device can have high reliability. In a room where the light-emitting device of one embodiment of the present invention is used for the indoor lighting device 901 as described above, a television set 902 of one embodiment of the present invention can be installed so that public broadcasting and movies can be watched.

Note that the structure described in this embodiment can be combined as appropriate with any of the structures described in the other embodiments.

EXAMPLE 1

In this example, a method of synthesizing 2-[3'-(dibenzothiophen-4-yl)biphenyl-3-yl]dibenzo[f,h]quinoxaline (abbreviation: 2mDBTBPDBq-II) represented by Structural Formula (101) given below will be described. Note that three different methods of synthesizing 2mDBTBPDBq-II (abbreviation) will be described in this example.

[4]

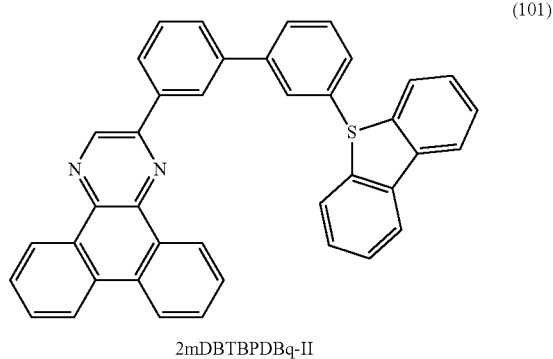

2mDBTBPDBq-II (Synthesis Method 1)

Described below is a method of synthesizing 2mDBTBP-DBq-II (abbreviation) with the use of an aryl boronic acid, which is one embodiment of the present invention.

Step 1: Synthesis of
4-(3-bromophenyl)dibenzothiophene

Synthesis Scheme (b-1) of 4-(3-bromophenyl)dibenzothiophene is shown below.

[5]

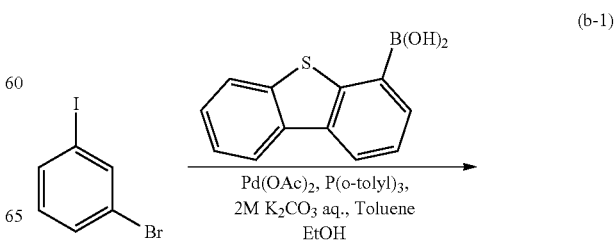

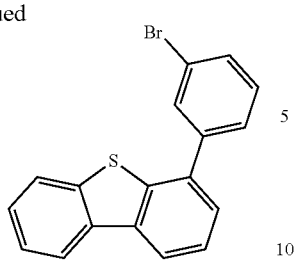

In a 50.0 L reaction vessel were put 1870 g (6.60 mol) of 3-bromoiodobenzene, 1370 g (6.00 mmol) of dibenzothiophene-4-boronic acid, 18.3 g (60.0 mmol) of tri(ortho-tolyl)phosphine (P(o-tolyl)$_3$), 1660 g (12.0 mol) of potassium carbonate, 6.00 L of water, 20.0 L of toluene, 10.0 L of ethanol, and 6.74 g (30.0 mmol) of palladium(II) acetate (Pd(OAc)$_2$), and the air in the reaction vessel was replaced with nitrogen. The mixture was stirred to be degassed while the pressure was reduced. The mixture was stirred at 75° C. under a nitrogen stream for 2 hours. After the stirring, an aqueous layer was removed from the mixture, and an organic layer of the mixture was subjected to suction filtration to give a filtrate. The obtained filtrate was concentrated to give an oily substance. About 2.00 L of toluene was added to the oily substance. The solution was put in a dropping funnel and then dripped into the 47.0 L hexane in the 50.0 L reaction vessel at a rate of 200 mL/min while the hexane is stirred, so that a solid was precipitated. The precipitated solid was collected by suction filtration and mixed with a solid obtained by concentrating the filtrate, and then the mixture was washed with about 4.50 L of cooled toluene. After the washing, the mixture was put in the 50.0 L reaction vessel, 10.0 L of ethanol was added, and the mixture was heated to 80° C. while being stirred to dissolve the solid. The mixture was left at the same temperature for 30 minutes to be separated into two layers. The upper layer of the mixture was cooled in an ice bath to be crystallized, so that a solid was obtained. The obtained solid was washed with 2.00 L of hexane to give 558 g of white powder, which was a target substance. The lower layer of the separated layers was cooled to room temperature to give a brown solid, and the brown solid was recrystallized with 2.60 L of ethanol to give a solid. The obtained solid was washed with 1.5 L of hexane to give 267 g of light-brown powder, which was a target substance. The total weight of the target substances was 825 g and the yield was 41%. The purity of the target substance (4-(3-bromophenyl)dibenzothiophene) was measured to be 94.0%.

Step 2: Synthesis of 3-(dibenzothiophen-4-yl)phenylboronic acid

Synthesis Scheme (b-2) of 3-(dibenzothiophen-4-yl)phenylboronic acid is shown below.

[6]

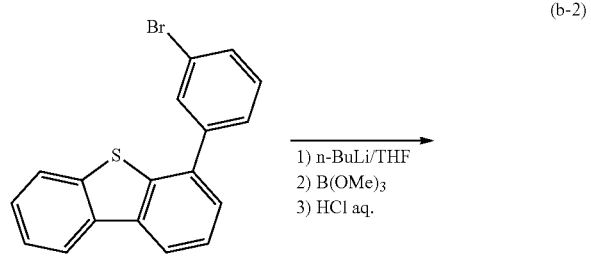

(b-2)

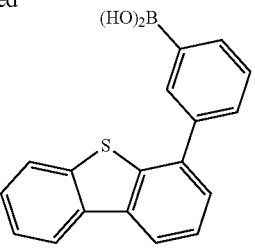

In a 50.0 L reaction vessel was put 720 g (2.20 mol) of 4-(3-bromophenyl)dibenzothiophene obtained in Step 1, and the air in the reaction vessel was replaced with argon. In the reaction vessel was put 18 L of dehydrated tetrahydrofuran (THF), and the solution was cooled to −80° C. Then, 1.50 L (2.40 mol) of n-butyllithium (1.6 mol/L solution of n-hexane) was dripped to the solution through a dropping funnel at a rate of 20 mL/min. After that, the solution was stirred for 3 hours while its temperature was raised to −60° C. After the stirring, the solution was cooled to −80° C., 265 g (2.50 mol) of trimethyl borate was added to this solution, and then the solution was stirred for 15 hours while its temperature was returned to room temperature. After the stirring, 3.00 L of dilute hydrochloric acid (1.0 mol/L) was added to this solution, followed by stirring for 2 hours. After the stirring, an aqueous layer of the mixture was extracted with ethyl acetate, and the obtained solution of the extract and an organic layer of the mixture were combined and washed with a saturated solution of sodium hydrogen carbonate. The organic layer was dried with magnesium sulfate, and then the mixture was subjected to gravity filtration. The obtained filtrate was concentrated to give an oily substance. To the obtained oily substance was added 5.00 L of toluene and the mixture was concentrated to give a solid. The obtained solid was washed with ice-cooled toluene to give 472 g of white powder, which was a target substance, in a yield of 73%.

Figure 9A:
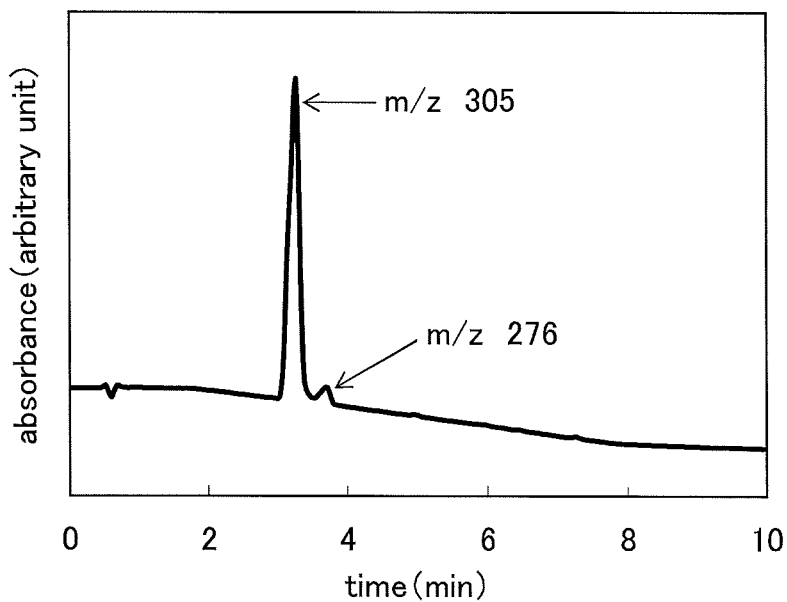
FIGS. 9A and 9B show UPLC data of a phenylboronic acid in Example 1.
Figure 9B:
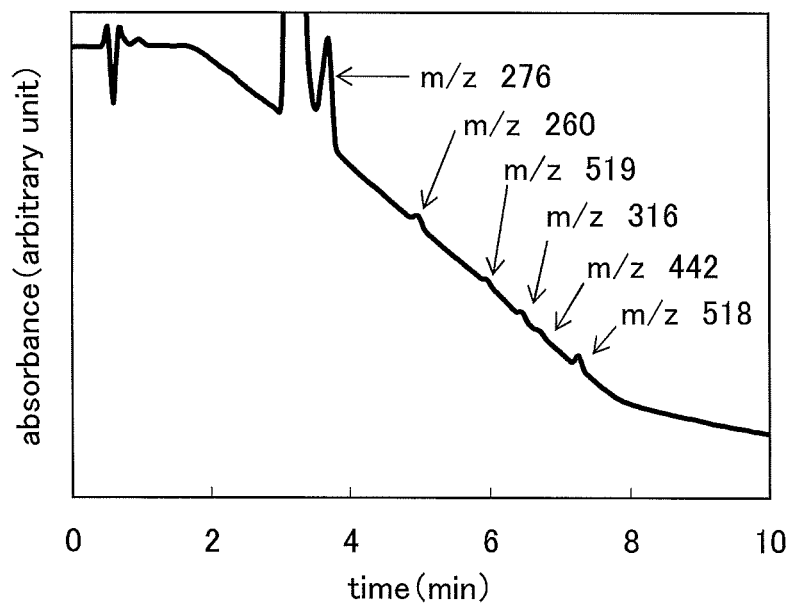

FIGS. 9A and 9B each show UPLC data of 3-(dibenzothiophen-4-yl)phenylboronic acid obtained in Step 2. In each of FIGS. 9A and 9B, the horizontal axis represents time (min) and the vertical axis represents absorbance (arbitrary unit). FIG. 9B is obtained by increasing the scale of the vertical axis of FIG. 9A. Note that 3-(dibenzothiophen-4-yl)phenylboronic acid used in Synthesis Method 1 is referred to as Sample 1.

The UPLC data of 3-(dibenzothiophen-4-yl)phenylboronic acid is described here. As an analysis apparatus for the UPLC, ACQUITY UPLC System (produced by Waters Corporation) was employed. The analysis was carried out using ACQUITY UPLC BEH C8 Column (particle diameter: 1.7 μm, 100 mm×2.1 mm) (produced by Waters Corporation) as a column at 40° C. Under the conditions where Mobile Phase A was acetonitrile and Mobile Phase B was a 0.1% formic acid aqueous solution, gradient analysis was performed in which the proportion of Mobile Phase A was increased at a flow rate of 0.5 mL/min to reach 40%, held for 1 minute, and then increased at a constant rate to reach 95% 10 minutes later. The injection amount was 5 μL. As a detector, a photodiode array (PDA) (absorption wavelength: 210 nm to 500 nm) was employed.

Step 3: Synthesis of 2-[3′-(dibenzothiophen-4-yl)biphenyl-3-yl]dibenzo[f,h]quinoxaline (abbreviation: 2mDBTBPDBq-II)

Synthesis Scheme (b-3) of 2-[3′-(dibenzothiophen-4-yl)biphenyl-3-yl]dibenzo[f,h]quinoxaline (abbreviation: 2mDBTBPDBq-II) is shown below.

[7]

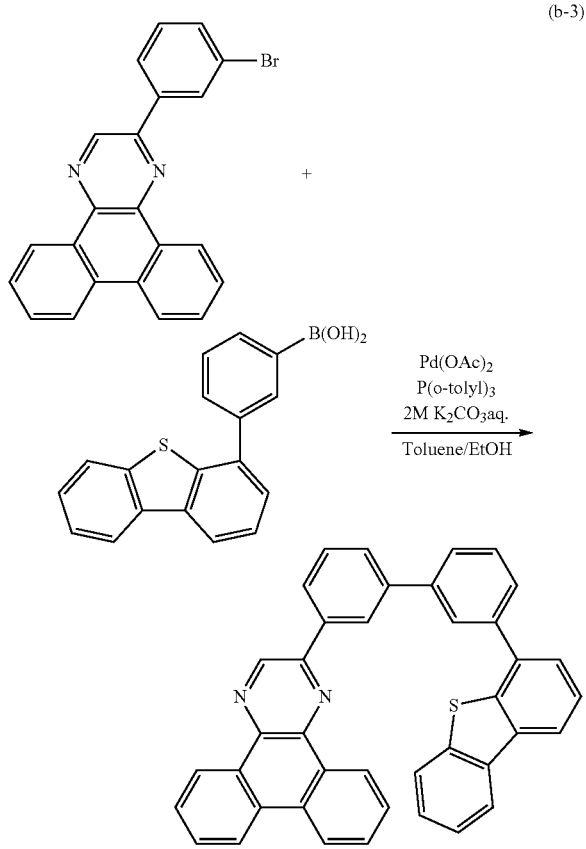

In a 200 mL three-neck flask were put 3.0 g (7.8 mmol) of 2-(3-bromophenyl)dibenzo[f,h]quinoxaline, 2.6 g (8.6 mmol) of 3-(dibenzothiophen-4-yl)phenylboronic acid obtained in Step 2, 0.24 g (0.78 mmol) of tri(ortho-tolyl) phosphine (P(o-tolyl)$_3$), 78 mL of toluene, 7.8 mL of ethanol, and 12 mL of 2.0 M potassium carbonate aqueous solution. The mixture was degassed by being stirred under reduced pressure, and the air in the flask was replaced with nitrogen. To the mixture was added 35 mg (0.16 mmol) of palladium(II) acetate. The mixture was stirred at 80° C. under a nitrogen stream for 8 hours. After a predetermined period of time had elapsed, the precipitated solid was separated by filtration to give a yellow solid. The solid was washed with water and ethanol, toluene was added thereto, and the resulting mixture was stirred while being heated. The toluene solution was suction-filtered to give 3.1 g of 2-[3'-(dibenzothiophen-4-yl) biphenyl-3-yl]dibenzo[f,h]quinoxaline (abbreviation: 2mDBTBPDBq-II) as a yellow solid (yellow powder) in a yield of 71%.

Then, 3.1 g of 2-[3'-(dibenzothiophen-4-yl)biphenyl-3-yl] dibenzo[f,h]quinoxaline (abbreviation: 2mDBTBPDBq-II), which had been obtained as the yellow powder, was purified by a train sublimation method. In the purification, 2-[3'-(dibenzothiophen-4-yl)biphenyl-3-yl]dibenzo[f,h]quinoxaline (abbreviation: 2mDBTBPDBq-II) was heated at 320° C. under the conditions where the pressure was 2.7 Pa and the argon flow rate was 15 mL/min. After the purification, 2.3 g of 2-[3'-(dibenzothiophen-4-yl)biphenyl-3-yl]dibenzo[f,h]quinoxaline (abbreviation: 2mDBTBPDBq-II) was obtained as yellow powder at a collection rate of 73%. Then, 2.3 g of 2-[3'-(dibenzothiophen-4-yl)biphenyl-3-yl]dibenzo[f,h]quinoxaline (abbreviation: 2mDBTBPDBq-II), which had been obtained as the yellow powder, was purified by a train sublimation method. In the purification, 2-[3'-(dibenzothiophen-4-yl)biphenyl-3-yl]dibenzo[f,h]quinoxaline (abbreviation: 2mDBTBPDBq-II) was heated at 320° C. under the conditions where the pressure was 2.7 Pa and the argon flow rate was 15 mL/min. After the purification, 1.9 g of 2-[3'-(dibenzothiophen-4-yl)biphenyl-3-yl]dibenzo[f,h]quinoxaline (abbreviation: 2mDBTBPDBq-II) was obtained as yellow powder at a collection rate of 82%.

The compound obtained through Reaction Scheme (b-3) was measured by a nuclear magnetic resonance ($^1$H NMR) method.

$^1$H NMR data of the obtained substance is as follows: $^1$H NMR (CDCl$_3$, 500 MHz):δ (ppm)=7.46-7.51 (m, 2H), 7.61-7.65 (m, 2H), 7.73-7.81 (m, 5H), 7.85-7.90 (m, 1H), 7.90 (d, H), 8.66 (d, J=8.0 Hz, 2H), 8.69 (s, 1H), 9.27 (dd, J=7.5 Hz, 1.7 Hz, 1H), 9.45 (d, J=8.0 Hz, 1H), 9.47 (s, 1H).

Figure 10A:
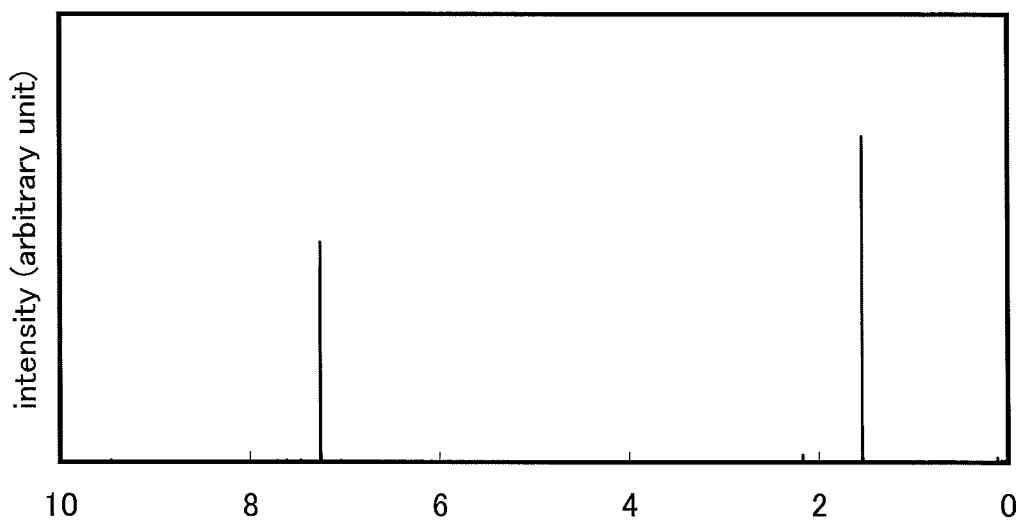
FIGS. 10A and 10B are $^1$H NMR charts of 2mDBTBP-DBq-II (abbreviation).
Figure 10B:
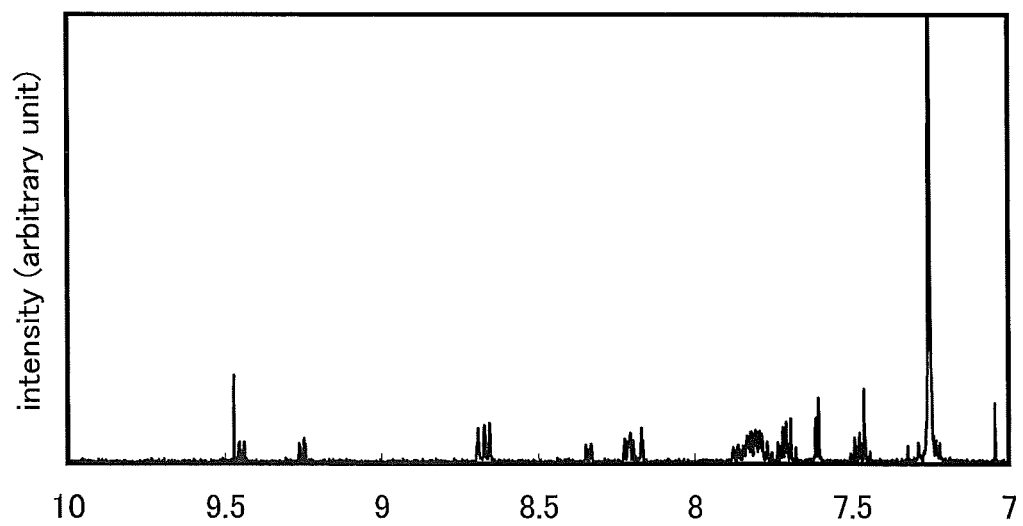

FIGS. 10A and 10B are $^1$H NMR charts. Note that FIG. 10B is an enlarged chart of FIG. 10A. The measurement results indicate that 2mDBTBPDBq-II (abbreviation), which was a target substance, was obtained.

(Synthesis Method 2)

Described below is a method of synthesizing 2mDBTBPDBq-II (abbreviation) with the use of an aryl boronic acid, which is one embodiment of the present invention.

Step 1: Synthesis of 2-(3-bromophenyl)dibenzo[f,h]quinoxaline

Synthesis Scheme (c-1) of 2-(3-bromophenyl)dibenzo[f,h] quinoxaline is shown below.

[8]

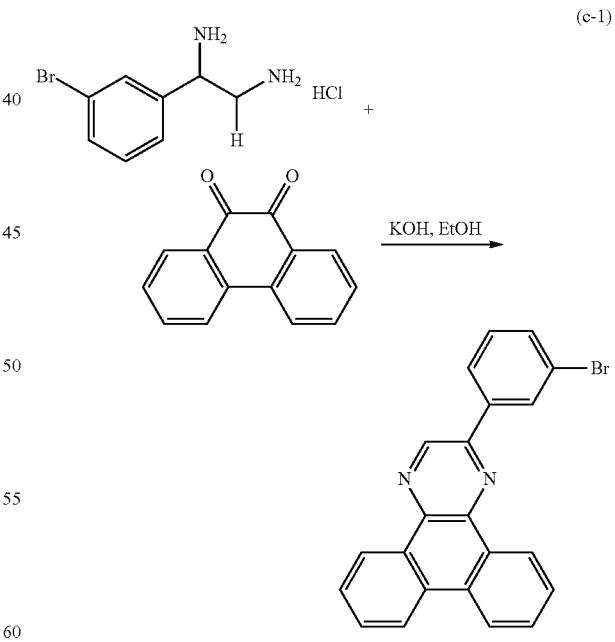

First, in a 500 mL three-neck flask were put 2.5 g of 1-(3-bromophenyl)ethane-1,2-diamine, 0.62 g of potassium hydroxide, and 200 mL of dry ethanol, and the air in the flask was replaced with nitrogen. The solution in the flask was refluxed for 2 hours, 2.1 g of 9,10-phenanthrenequinone was added thereto, and the solution was refluxed for 9 hours. After that, the obtained mixture was suction-filtered, and the resulting solid was washed with ethanol to give 2-(3-bromophenyl)dibenzo[t h]quinoxaline as a yellow-white solid in a yield of 70%.

Step 2: Purification of
3-(dibenzothiophen-4-yl)phenylboronic acid

Described below is a purification scheme of 3-(dibenzothiophen-4-yl)phenylboronic acid shown in Structural Formula (102) given below.

[9]

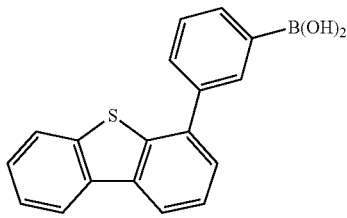

(102)

In a 100 mL three-neck flask were put 4.0 g (13.2 mmol) of 3-(dibenzothiophen-4-yl)phenylboronic acid, 40 mL of THF, and 1 mL of water to dissolve the 3-(dibenzothiophen-4-yl)phenylboronic acid. The THF solution was transferred to a separating funnel. In the separating funnel were put 18 mL of a 1.0 M D-sorbitol aqueous solution, 40 mL of a 1.0 M sodium carbonate aqueous solution, and 20 mL of ethyl acetate, and adjustment was performed so that the PH of an aqueous layer became 10. The separating funnel was shaken so that the solution was separated into the aqueous layer and an organic layer, and the aqueous layer was extracted from the funnel. The extracted aqueous layer was returned to the separating funnel, and 50 mL of ethyl acetate was added thereto. Further, adjustment was performed using a 1N HCl aqueous solution so that the PH of the aqueous layer became 1 to 5, and the aqueous layer was extracted with ethyl acetate. The obtained organic layer was dried with magnesium sulfate. The obtained mixture was gravity-filtered, and the filtrate was concentrated to give 3.0 g of a white solid in a yield of 75%.

Figure 11A:
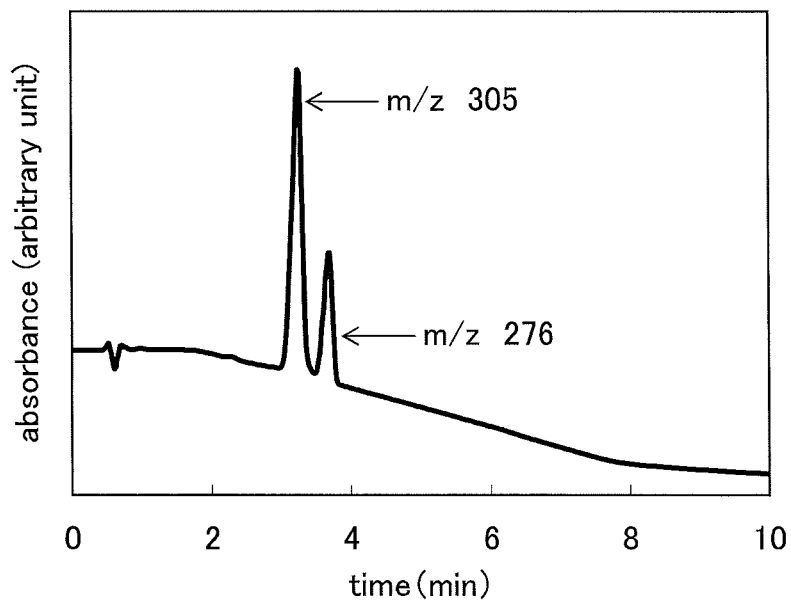
FIGS. 11A and 11B show UPLC data of a phenylboronic acid in Example 1.
Figure 11B:
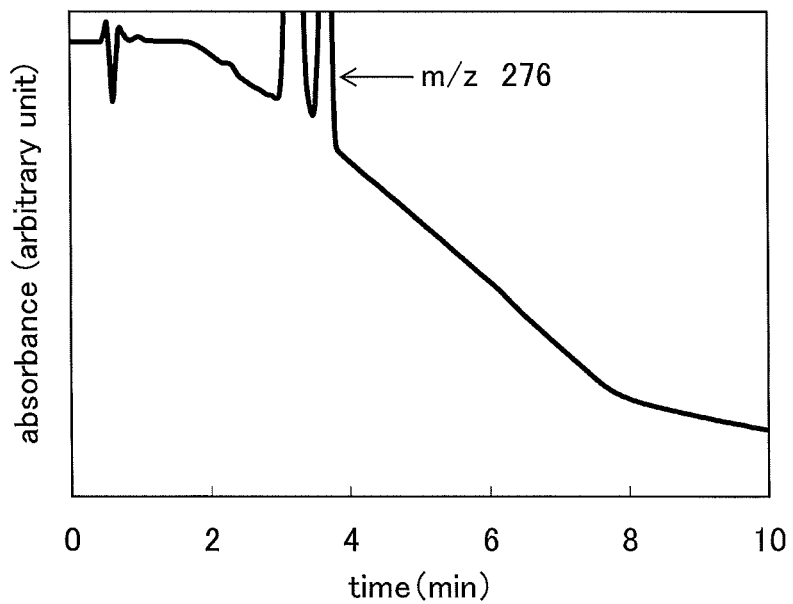

FIGS. 11A and 11B each show UPLC data of 3-(dibenzothiophen-4-yl)phenylboronic acid subjected to the purification. In each of FIGS. 11A and 11B, the horizontal axis represents time (min) and the vertical axis represents absorbance (arbitrary unit). FIG. 11B is obtained by increasing the scale of the vertical axis of FIG. 11A. Note that 3-(dibenzothiophen-4-yl)phenylboronic acid used in Synthesis Method 2 is referred to as Sample 2. Note that the UPLC data of Sample 2 was obtained in a manner similar to that for the UPLC data of Sample 1 described above in Synthesis Method 1; thus, the description thereof is not given here.

Step 3: Synthesis of 2-[3'-(dibenzothiophen-4-yl)biphenyl-3-yl]dibenzo[f,h]quinoxaline (abbreviation: 2mDBTBPDBq-II)

Synthesis Scheme (c-2) of 2-[3'-(dibenzothiophen-4-yl)biphenyl-3-yl]dibenzo[f,h]quinoxaline (abbreviation: 2mDBTBPDBq-II) is shown below.

[10]

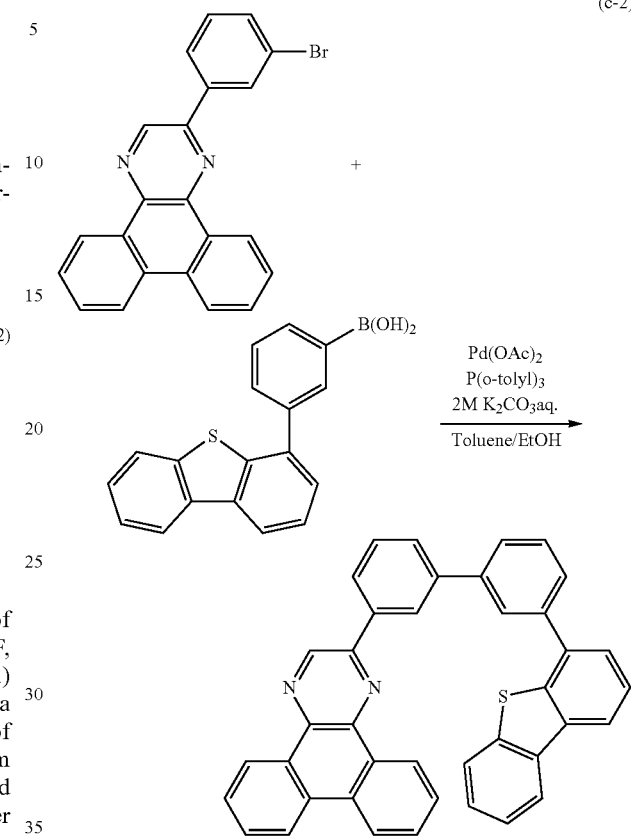

(c-2)

In a 200 mL three-neck flask were put 3.0 g (7.8 mmol) of 2-(3-bromophenyl)dibenzo[f,h]quinoxaline obtained through Step 1, 2.6 g (8.6 mmol) of 3-(dibenzothiophen-4-yl)phenylboronic acid, 0.24 g (0.78 mmol) of tri(ortho-tolyl)phosphine (P(o-tolyl)$_3$), 78 mL of toluene, 7.8 mL of ethanol, and 12 mL of a 2.0 M of potassium carbonate aqueous solution. The mixture was degassed by being stirred under reduced pressure, and the air in the flask was replaced with nitrogen. To this mixture was added 35 mg (0.16 mmol) of palladium(II) acetate (Pd(OAc)$_2$). The mixture was stirred at 80° C. under a nitrogen stream for 8 hours. After a predetermined period of time had elapsed, the precipitated solid was separated by filtration to give a yellow solid. The solid was washed with water and ethanol, toluene was added thereto, and the resulting mixture was stirred while being heated. The toluene solution was suction-filtered to give 2.7 g of 2-[3'-(dibenzothiophen-4-yl)biphenyl-3-yl]dibenzo[f,h]quinoxaline as a yellow solid (yellow powder) in a yield of 61%.

Then, 2.7 g of 2-[3'-(dibenzothiophen-4-yl)biphenyl-3-yl]dibenzo[f,h]quinoxaline (abbreviation: 2mDBTBPDBq-II), which had been obtained as the yellow powder, was purified by a train sublimation method. In the purification, 2-[3'-(dibenzothiophen-4-yl)biphenyl-3-yl]dibenzo[f,h]quinoxaline (abbreviation: 2mDBTBPDBq-II) was heated at 320° C. under the conditions where the pressure was 2.7 Pa and the argon flow rate was 15 mL/min. After the purification, 2.3 g of 2-[3'-(dibenzothiophen-4-yl)biphenyl-3-yl]dibenzo[f,h]quinoxaline (abbreviation: 2mDBTBPDBq-II) was obtained as yellow powder at a collection rate of 85%. Then, 2.3 g of 2-[3'-(dibenzothiophen-4-yl)biphenyl-3-yl]dibenzo[f,h]quinoxaline(abbreviation: 2mDBTBPDBq-II), which had been obtained as the yellow powder, was purified by a train sublimation method. In the purification, 2-[3'-(dibenzothiophen-4-yl)biphenyl-3-yl]dibenzo[f,h]quinoxaline (abbreviation: 2mDBTBPDBq-II) was heated at 320° C. under the conditions where the pressure was 2.7 Pa and the argon flow rate was 15 mL/min. After the purification, 1.7 g of 2-[3'-(dibenzothiophen-4-yl)biphenyl-3-yl]dibenzo[f,h]quinoxaline (abbreviation: 2mDBTBPDBq-II) was obtained as white powder at a collection rate of 74%.

The compound obtained through Reaction Scheme (c-2) was measured by a nuclear magnetic resonance ($^1$H NMR) method.

$^1$H NMR data of the obtained substance is as follows: $^1$H NMR (CDCl$_3$, 500 MHz):δ (ppm)=7.46-7.51 (m, 2H), 7.61-7.65 (m, 2H), 7.73-7.81 (m, 5H), 7.85-7.90 (m, 1H), 7.90 (d, H), 8.66 (d, J=8.0 Hz, 2H), 8.69 (s, 1H), 9.27 (dd, J=7.5 Hz, 1.7 Hz, 1H), 9.45 (d, J=8.0 Hz, 1H), 9.47 (s, 1H).

Figure 12A:
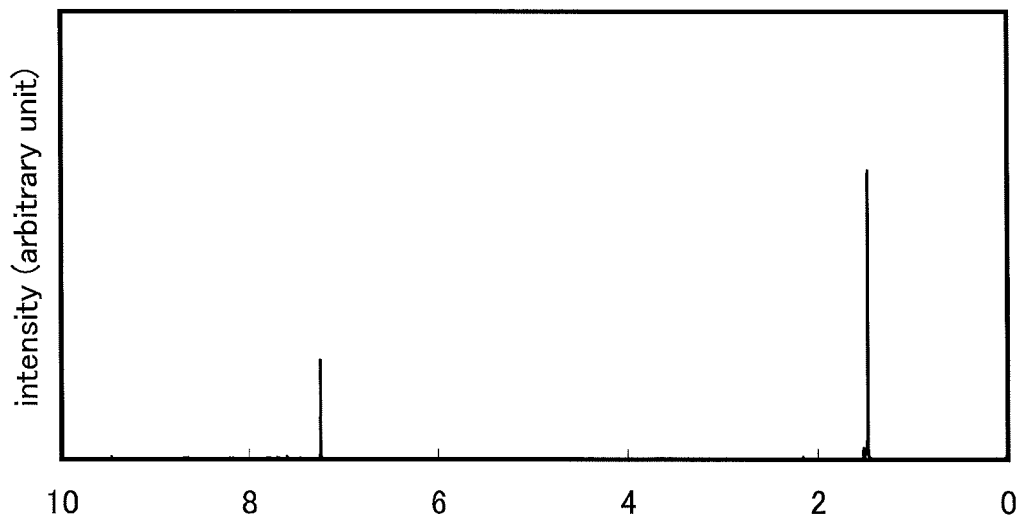
FIGS. 12A and 12B are $^1$H NMR charts of 2mDBTBP-DBq-II (abbreviation).
Figure 12B:
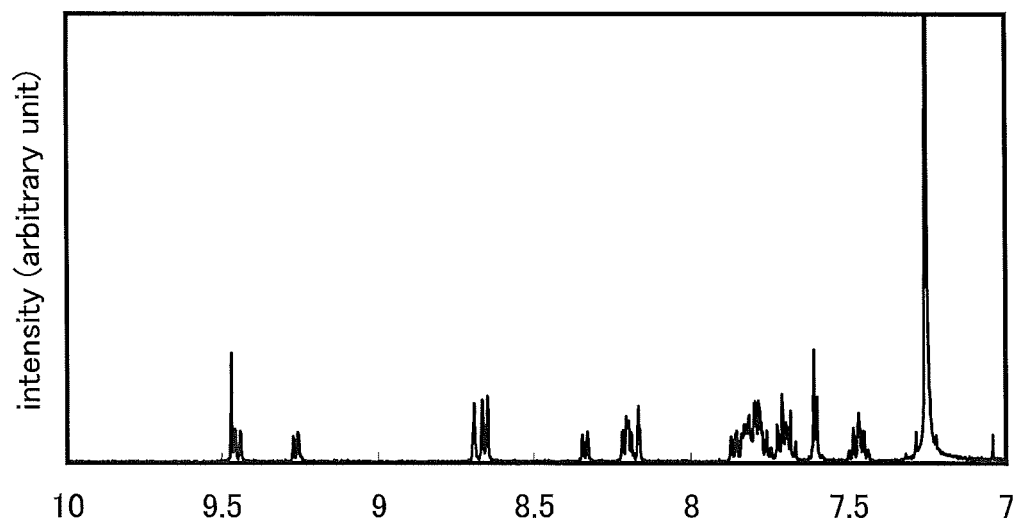

FIGS. 12A and 12B are $^1$H NMR charts. Note that FIG. 12B is an enlarged chart of FIG. 12A. The measurement results indicate that 2mDBTBPDBq-II (abbreviation), which was a target substance, was obtained.

(Synthesis Method 3)

Described below is a method of synthesizing 2mDBTBP-DBq-II (abbreviation) with the use of an aryl boronic acid, which is one embodiment of the present invention. Note that Synthesis Method 2 described above can be referred to for similar parts; thus, the description of the similar parts is not given here.

Step 1: Synthesis of 2-(3-bromophenyl)dibenzo[f,h]quinoxaline

In a similar manner to Step 1 of Synthesis Method 2, which is described above, 2-(3-bromophenyl)dibenzo[f,h]quinoxaline is synthesized.

Step 2: Purification of 3-(dibenzothiophen-4-yl)phenylboronic acid

In a 500 mL three-neck flask were put 5.0 g (16.4 mmol) of 3-(dibenzothiophen-4-yl)phenylboronic acid, 100 mL of THF, 100 mL of ethyl acetate, and 1 mL of water to dissolve the 3-(dibenzothiophen-4-yl)phenylboronic acid. The solution was transferred to a separating funnel. In the separating funnel were put 26 mL of 1.0 M D-sorbitol aqueous solution and 100 mL of a 1.0 M sodium carbonate aqueous solution, and adjustment was performed so that the PH of an aqueous layer became 10. The separating funnel was shaken so that the solution was separated into the aqueous layer (Aqueous Layer 1) and an organic layer. The organic layer was transferred to the separating funnel. In the separating funnel were put 26 mL of a 1.0 M D-sorbitol aqueous solution and 100 mL of a 1.0 M sodium carbonate aqueous solution, and adjustment was performed so that the PH of an aqueous layer became 10. The separating funnel was shaken so that the solution was separated into the aqueous layer (Aqueous Layer 2) and an organic layer. Next, the obtained Aqueous Layer 1 and Aqueous Layer 2 were mixed to obtain an aqueous solution of a 3-(dibenzothiophen-4-yl)phenylboronic acid-sorbitol complex. Note that in the aqueous solution, 3-(dibenzothiophen-4-yl)phenylboronic acid and sorbitol form a complex. In other words, ionized sorbitol is bonded to 3-(dibenzothiophen-4-yl)phenylboronic acid. The weight of the aqueous layer was measured and the amount of 3-(dibenzothiophen-4-yl)phenylboronic acid included in the aqueous layer was obtained by HPLC with the use of separately synthesized 3-(dibenzothiophen-4-yl)phenylboronic acid to obtain 230 mL of an aqueous solution including 4.5 g (14.8 mmol) of 3-(dibenzothiophen-4-yl)phenylboronic acid. Note that although an aqueous solution of sorbitol was used for the purification of 3-(dibenzothiophen-4-yl)phenylboronic acid in this example, the aqueous solution to be used is not limited thereto. A variety of aqueous solutions can be used as long as the aqueous solutions are polyol solutions.

Figure 20A:
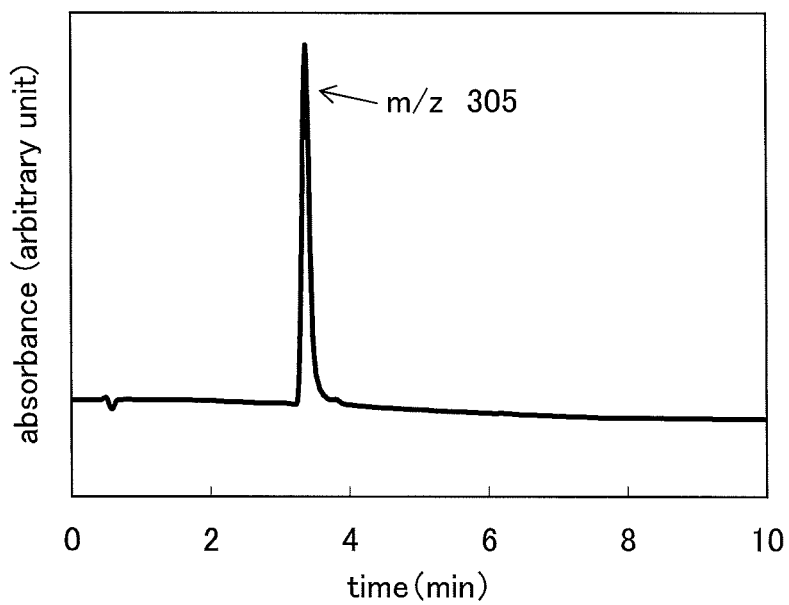
FIGS. 20A and 20B show UPLC data of an aqueous solution of a phenylboronic acid in Example 1.
Figure 20B:
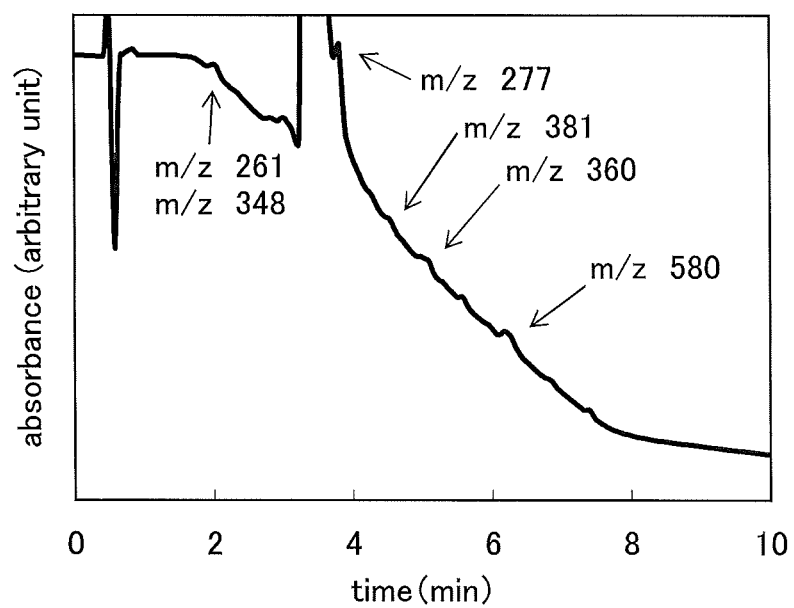

FIGS. 20A and 20B each show UPLC data of an aqueous solution of 3-(dibenzothiophen-4-yl)phenylboronic acid subjected to the purification. In each of FIGS. 20A and 20B, the horizontal axis represents time (min) and the vertical axis represents absorbance (arbitrary unit). FIG. 20B is obtained by increasing the scale of the vertical axis of FIG. 20A. Note that 3-(dibenzothiophen-4-yl)phenylboronic acid used in Synthesis Method 3 is referred to as Sample 3.

Synthesis of 2-[3'-(dibenzothiophen-4-yl)biphenyl-3-yl]dibenzo[f,h]quinoxaline (abbreviation: 2mDBTB-PDBq-II)

Next, in a 500 mL three-neck flask were put 5.7 g (14.8 mmol) of 2-(3-bromophenyl)dibenzo[f,h]quinoxaline obtained through Step 1, 230 mL of an aqueous solution of a 3-(dibenzothiophen-4-yl)phenylboronic acid-sorbitol complex purified in Step 2, 0.18 g (0.59 mmol) of tri(ortho-tolyl)phosphine (P(o-tolyl)$_3$), 74 mL of toluene, and 36 mL of ethanol. The mixture was degassed by being stirred under reduced pressure, and the air in the flask was replaced with nitrogen. In the mixture was put 66 mg (0.30 mmol) of palladium(II) acetate (Pd(OAc)$_2$). The mixture was stirred at 80° C. under a nitrogen stream for 4 hours. After a predetermined period of time had elapsed, the precipitated solid was separated by filtration to give a yellow solid. The solid was washed with water and ethanol, toluene was added thereto, and the resulting mixture was stirred while being heated. The toluene solution was suction-filtered to give 6.0 g of 2-[3'-(dibenzothiophen-4-yl)biphenyl-3-yl]dibenzo[f,h]quinoxaline (abbreviation: 2mDBTBPDBq-II) as a yellow solid in a yield of 72%.

(Comparative Synthesis Method 4)

Described below is a method of synthesizing 2mDBTBP-DBq-II (abbreviation), for comparison, with the use of an aryl boronic acid.

Step 1: Synthesis of 2-(3-bromophenyl)dibenzo[f,h]quinoxaline

Synthesis Scheme (d-1) of 2-(3-bromophenyl)dibenzo[f,h]quinoxaline is shown below.

[11]

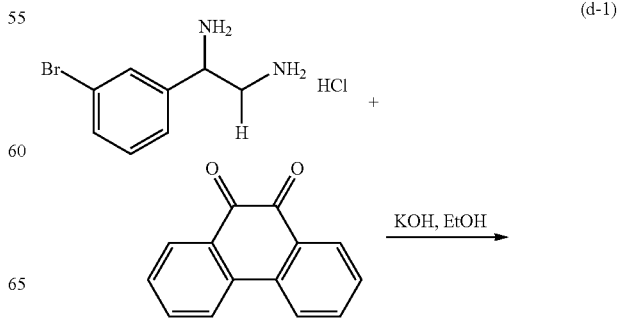

(d-1)

35

-continued

[13]

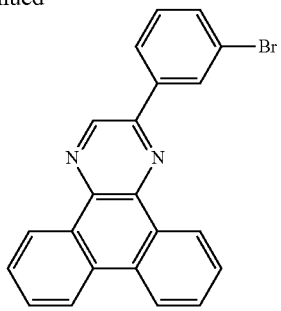

First, in a 500 mL three-neck flask were put 2.5 g of 1-(3-bromophenyl)ethane-1,2-diamine, 0.62 g of potassium hydroxide, and 200 mL of dry ethanol, and the air in the flask was replaced with nitrogen. The solution in the flask was refluxed for 2 hours, 2.1 g of 9,10-phenanthrenequinone was added thereto, and the solution was refluxed for 9 hours. After that, the obtained mixture was suction-filtered, and the resulting solid was washed with ethanol to give 2-(3-bromophenyl)dibenzo[f,h]quinoxaline as a yellow-white solid in a yield of 70%.

Step 2: Analysis of 3-(dibenzothiophen-4-yl)phenylboronic acid

Next, 3-(dibenzothiophen-4-yl)phenylboronic acid shown in Structural Formula (102) given below was analyzed. Note that in Comparative Synthesis Method 4, 3-(dibenzothiophen-4-yl)phenylboronic acid, which had not been purified, was analyzed.

[12]

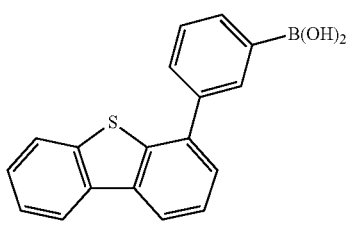

(102)

Figure 13A:
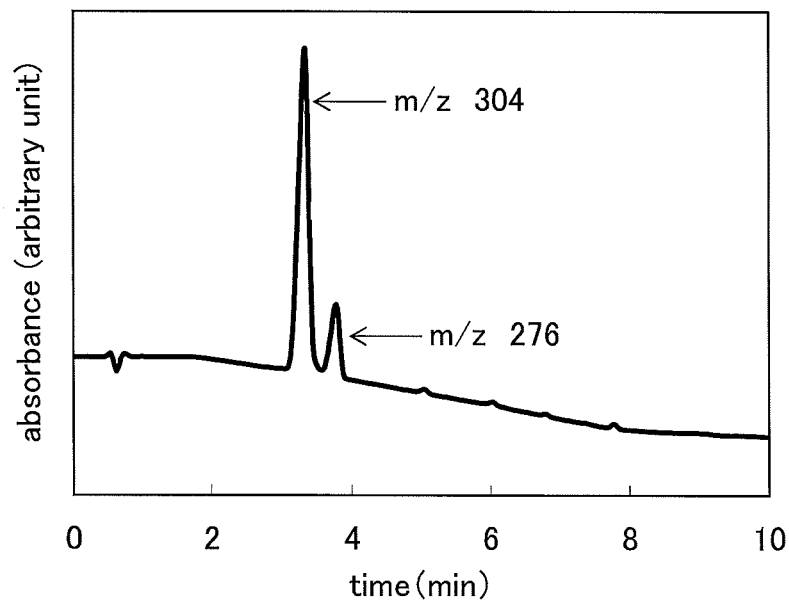
FIGS. 13A and 13B show UPLC data of a phenylboronic acid in Example 1.
Figure 13B:
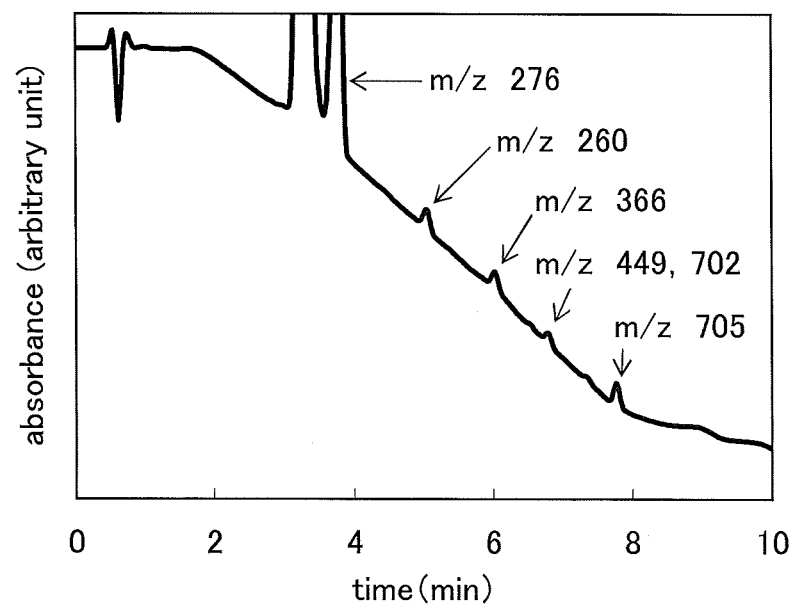

FIGS. 13A and 13B each show UPLC data of 3-(dibenzothiophen-4-yl)phenylboronic acid which had not been purified. In each of FIGS. 13A and 13B, the horizontal axis represents time (min) and the vertical axis represents absorbance (arbitrary unit). FIG. 13B is obtained by increasing the scale of the vertical axis of FIG. 13A. Note that 3-(dibenzothiophen-4-yl)phenylboronic acid used in Comparative Synthesis Method 4 is referred to as Sample 4. Note that the UPLC data of Sample 4 was obtained in a manner similar to that for the UPLC data of Sample 1 in described above in Synthesis Method 1; thus, the description thereof is not given here.

Step 3: Synthesis of 2-[3'-(dibenzothiophen-4-yl)biphenyl-3-yl]dibenzo[f,h]quinoxaline (abbreviation: 2mDBTBPDBq-II)

Synthesis Scheme (d-2) of 2-[3'-(dibenzothiophen-4-yl)biphenyl-3-yl]dibenzo[f,h]quinoxaline (abbreviation: 2mDBTBPDBq-II) is shown below.

36

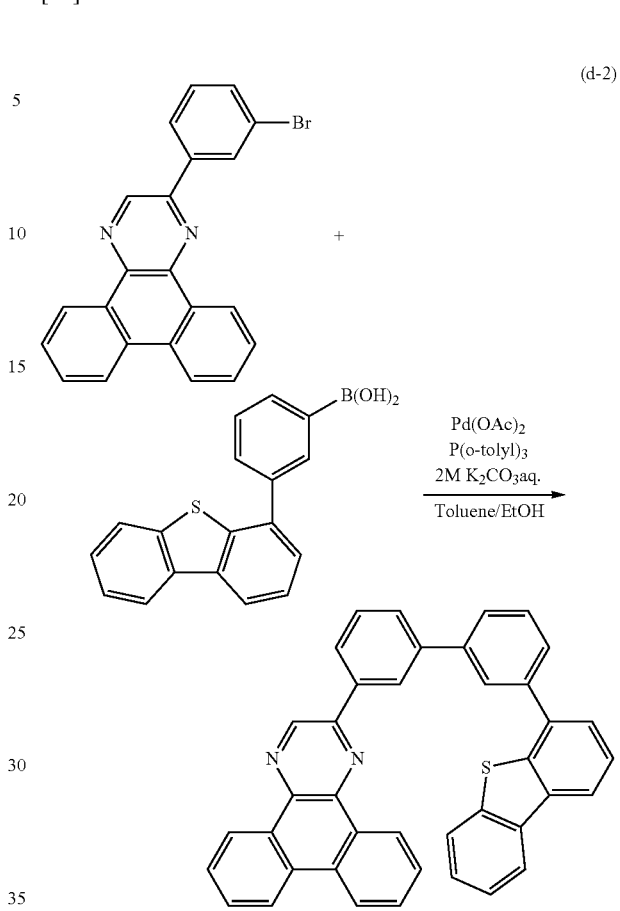

(d-2)

In a 100 mL three-neck flask were put 1.2 g (3.1 mmol) of 2-(3-bromophenyl)dibenzo[f,h]quinoxaline obtained through Step 1, 1.0 g (3.4 mmol) of 3-(dibenzothiophen-4-yl)phenylboronic acid of Step 2, 94 mg (0.31 mmol) of tri(ortho-tolyl)phosphine (P(o-tolyl)$_3$), 30 mL of toluene, 3.0 mL of ethanol, and 4.5 mL of a 2.0 M potassium carbonate aqueous solution. The mixture was degassed by being stirred under reduced pressure, and the air in the flask was replaced with nitrogen. In the mixture was put 14 mg (0.062 mmol) of palladium(II) acetate (Pd(OAc)$_2$). The mixture was stirred at 80° C. under a nitrogen stream for 8 hours. After a predetermined period of time had elapsed, the precipitated solid was separated by filtration to give a yellow solid. The solid was washed with water and ethanol, toluene was added thereto, and the resulting mixture was stirred while being heated. The toluene solution was suction-filtered to give 1.1 g of 2-[3'-(dibenzothiophen-4-yl)biphenyl-3-yl]dibenzo[f,h]quinoxaline (abbreviation: 2mDBTBPDBq-II) as a yellow solid (yellow powder) in a yield of 62%.

Then, 1.1 g of 2-[3'-(dibenzothiophen-4-yl)biphenyl-3-yl]dibenzo[f,h]quinoxaline (abbreviation: 2mDBTBPDBq-II), which had been obtained as the yellow powder, was purified by a train sublimation method. In the purification, 2-[3'-(dibenzothiophen-4-yl)biphenyl-3-yl]dibenzo[f,h]quinoxaline (abbreviation: 2mDBTBPDBq-II) was heated at 320° C. under the conditions where the pressure was 2.7 Pa and the argon flow rate was 10 mL/min. After the purification, 0.82 g of 2-[3'-(dibenzothiophen-4-yl)biphenyl-3-yl]dibenzo[f,h]quinoxaline (abbreviation: 2mDBTBPDBq-II) was obtained as yellow powder at a collection rate of 75%. Then, 0.82 g of 2-[3'-(dibenzothiophen-4-yl)biphenyl-3-yl]dibenzo[f,h]quinoxaline (abbreviation: 2mDBTBPDBq-II), which had been obtained as the yellow powder, was purified by a train sublimation method. In the purification, 2-[3'-(dibenzothiophen-4-yl)biphenyl-3-yl]dibenzo[f,h]quinoxaline (abbreviation: 2mDBTBPDBq-II) was heated at 320° C. under the conditions where the pressure was 2.7 Pa and the argon flow rate was 10 mL/min. After the purification, 0.64 g of 2-[3'-(dibenzothiophen-4-yl)biphenyl-3-yl]dibenzo[f,h]quinoxaline (abbreviation: 2mDBTBPDBq-II) was obtained as yellow powder at a collection rate of 78%.

The compound obtained through Reaction Scheme (d-2) was measured by a nuclear magnetic resonance ($^1$H NMR) method.

$^1$H NMR data of the obtained substance is as follows: $^1$H NMR (CDCl$_3$, 500 MHz):δ (ppm)=7.46-7.51 (m, 2H), 7.61-7.65 (m, 2H), 7.73-7.81 (m, 5H), 7.85-7.90 (m, 1H), 7.90 (d, H), 8.66 (d, J=8.0 Hz, 2H), 8.69 (s, 1H), 9.27 (dd, J=7.5 Hz, 1.7 Hz, 1H), 9.45 (d, J=8.0 Hz, 1H), 9.47 (s, 1H).

Figure 14A:
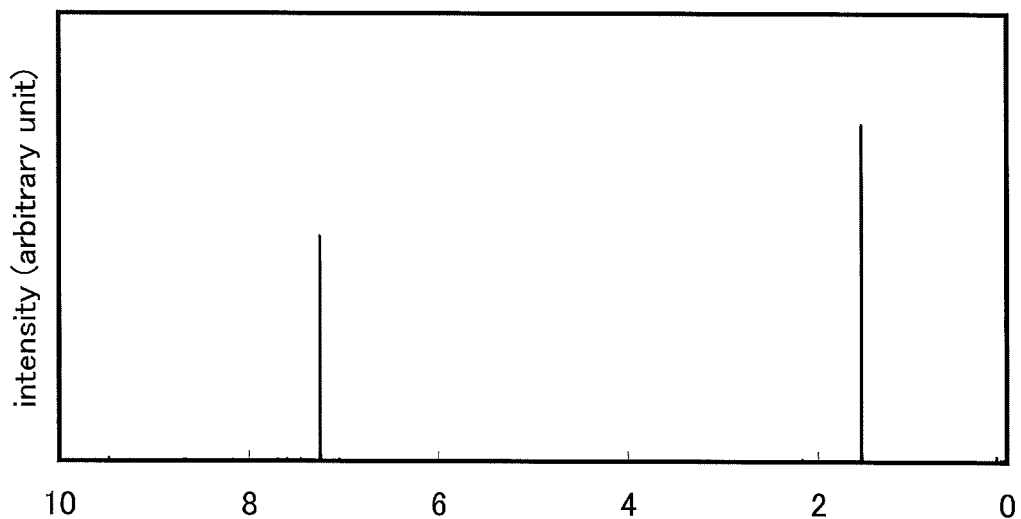
FIGS. 14A and 14B are $^1$H NMR charts of 2mDBTBP-DBq-II (abbreviation).
Figure 14B:
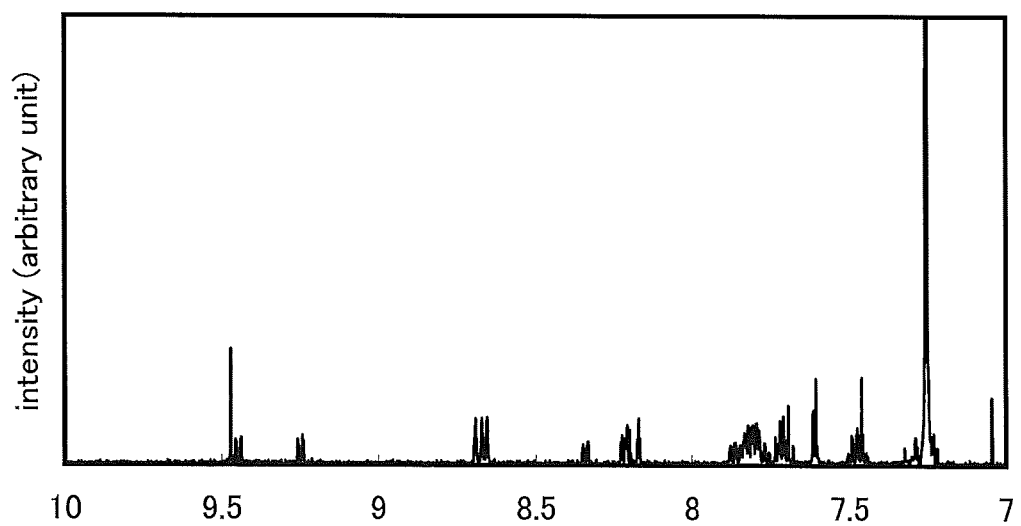

FIGS. 14A and 14B are $^1$H NMR charts. Note that FIG. 14B is an enlarged chart of FIG. 14A. The measurement results indicate that 2mDBTBPDBq-II (abbreviation), which was a target substance, was obtained.

Table 1 shows the impurity concentration of 3(dibenzothiophen-4-yl)phenylboronic acid (Samples 1 to 4) used in Synthesis Method 1, Synthesis Method 2, Synthesis Method 3, and Comparative Synthesis Method 4. Note that the content percentage (%) of an impurity in each sample was obtained by calculating a peak area from the chromatogram. In the calculation of the peak area, a peak detected within one minute was excluded because the peak resulted from chloroform used for dissolving the material.

TABLE 1

| | *1 (m/z 304 or 305) | First impurity (m/z 260) | Second impurity (m/z 276 or m/z 277) | Impurity other than first impurity and second impurity | Remarks |
| --- | --- | --- | --- | --- | --- |
| Sample 1 | 94.0 | 0.3 | 5.0 | 0.7 | present invention |
| Sample 2 | 72.1 | 27.5 | 0.4 | 0.0 | present invention |
| Sample 3 | 98.7 | 0.0 | 0.4 | 0.9 | present invention |
| Sample 4 | 81.3 | 0.7 | 16.4 | 1.6 | comparative synthesis method |

*1: 3(dibenzothiophen-4-yl)phenylboronic acid
*Unit: %

FIGS. 9A and 9B, FIGS. 11A and 11B, FIGS. 13A and 13B, FIGS. 20A and 20B, and Table 1 demonstrate that the aryl boronic acid (3-(dibenzothiophen-4-yl)phenylboronic acid: Samples 1 to 4) used for an EL material, which is one embodiment of the present invention, included at least one of a first impurity (m/z 260) in which a dihydroxyboryl group of the aryl boronic acid was substituted by hydrogen and a second impurity (m/z 276 or m/z 277) in which a molecular mass of 16 or 17 is added to the molecular mass of the first impurity (m/z 260).

In Sample 1, the concentration of an impurity other than the first impurity (m/z 260) and the second impurity (m/z 276 or m/z 277) was 1% or lower, specifically, 0.7%. In Sample 2, the concentration of an impurity other than the first impurity (m/z 260) and the second impurity (m/z 276 or m/z 277) was 1% or lower, specifically, 0%. In Sample 3, the concentration of an impurity other than the first impurity (m/z 260) and the second impurity (m/z 276 or m/z 277) was 1% or lower, specifically, 0.9%. In Comparative Sample 4, the concentration of an impurity other than the first impurity (m/z 260) and the second impurity (m/z 276 or m/z 277) was 1.6%.

EXAMPLE 2

Figure 15:
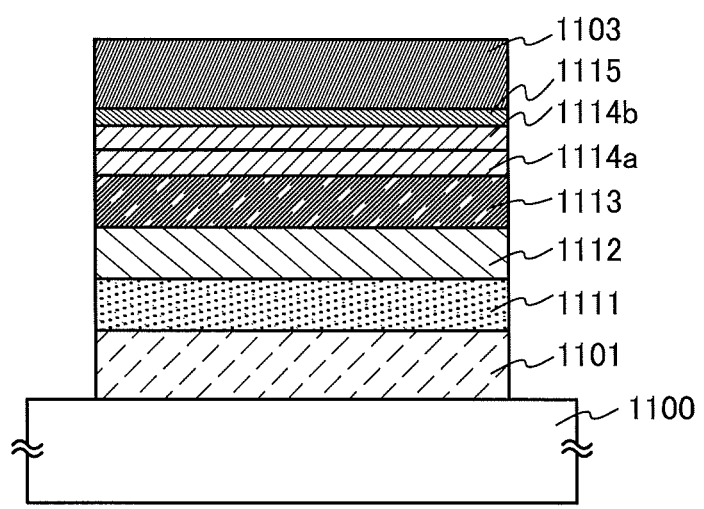
FIG. 15 illustrates light-emitting elements in Example 2.

In this example, light-emitting elements of embodiments of the present invention (a light-emitting element 1, a light-emitting element 2, and a light-emitting element 3), and a light-emitting element for comparison (a comparative light-emitting element 4) will be described with reference to FIG. 15. Chemical formulae of materials used in this example are shown below.

[14]

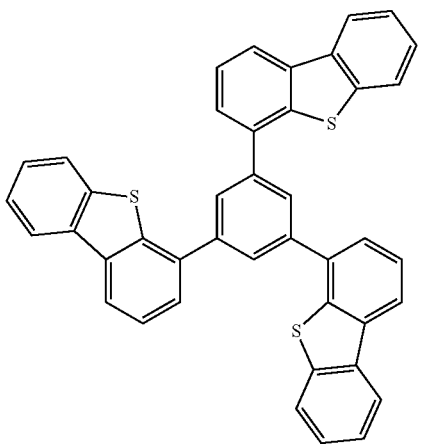

DBT3P-II

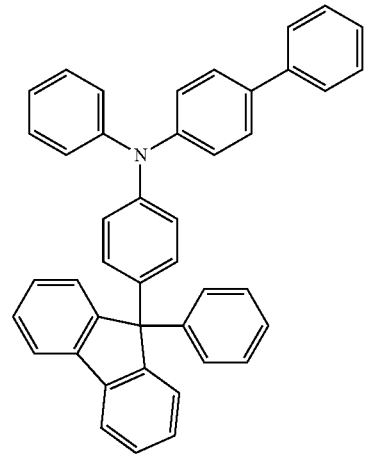

BPAFLP

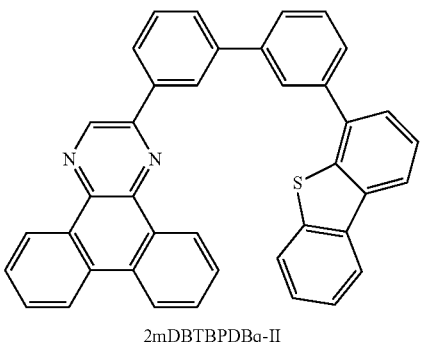

2mDBTBPDBq-II

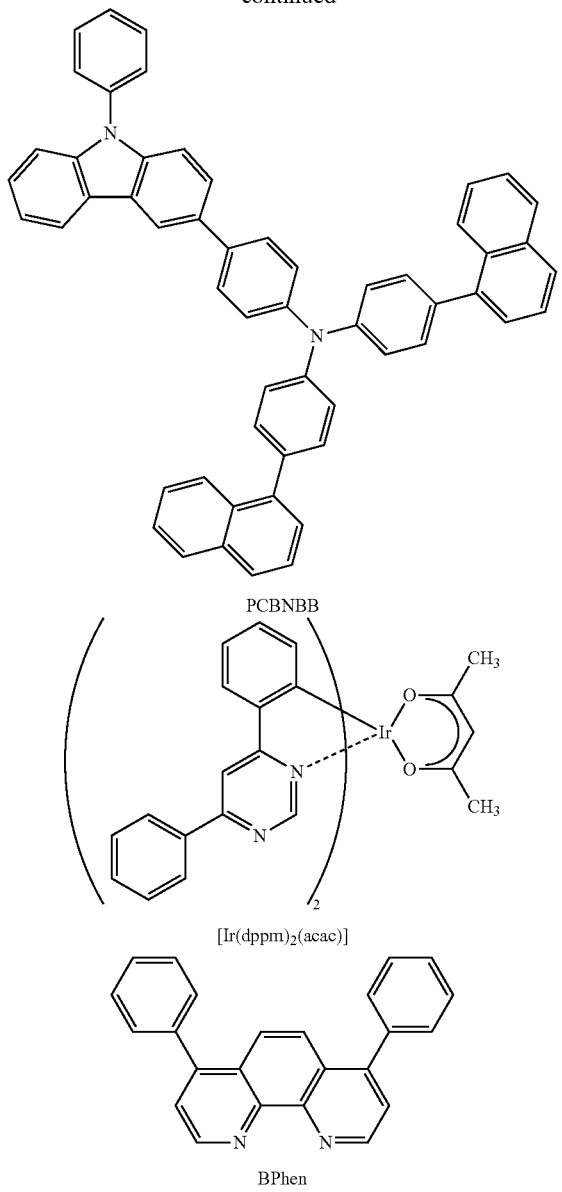

Methods for manufacturing the light-emitting element 1, the light-emitting element 2, the light-emitting element 3, and the comparative light-emitting element 4 of this example are described below.

(Light-Emitting Element 1)

First, over a substrate 1100, an indium oxide-tin oxide compound containing silicon or silicon oxide (ITO—SiO$_2$, hereinafter abbreviated to ITSO) was deposited by a sputtering method, whereby a first electrode 1101 was formed. Note that the composition ratio of In$_2$O$_3$ to SnO$_2$ and SiO$_2$ in the target used was 85:10:5 [wt %]. The thickness of the first electrode 1101 was 110 nm and the electrode area was 2 mm×2 mm. Here, the first electrode 1101 functions as an anode of the light-emitting element.

Next, as pretreatment for forming the light-emitting element over the substrate 1100, the surface of the substrate was washed with water, baked at 200° C. for 1 hour, and subjected to UV ozone treatment for 370 seconds.

After that, the substrate 1100 was transferred into a vacuum evaporation apparatus where the pressure had been reduced to approximately 10$^{-4}$ Pa, and subjected to vacuum baking at 170° C. for 30 minutes in a heating chamber of the vacuum evaporation apparatus, and then the substrate 1100 was cooled down for about 30 minutes.

Then, the substrate 1100 over which the first electrode 1101 was formed was fixed to a substrate holder provided in the vacuum evaporation apparatus so that the surface provided with the first electrode 1101 faced downward. The pressure in the vacuum evaporation apparatus was reduced to about 10$^{-4}$ Pa. After that, on the first electrode 1101, by an evaporation method using resistance heating, 4,4',4"-(benzene-1,3,5-triyl)tri(dibenzothiophene) (abbreviation: DBT3P-II) and molybdenum oxide were deposited by co-evaporation, whereby a hole-injection layer 1111 was formed. The thickness of the hole-injection layer 1111 was set to 27 nm, and the weight ratio of DBT3P-II (abbreviation) to molybdenum oxide was adjusted to 4:2 (=DBT3P-II: molybdenum oxide).

Next, 4-phenyl-4'-(9-phenylfluoren-9-yl)triphenylamine (abbreviation: BPAFLP) was deposited on the hole-injection layer 1111 by co-evaporation, whereby a hole-transport layer 1112 was framed. The thickness of the hole-transport layer 1112 was set to 20 nm Next, on the hole-transport layer 1112, 2-[3'-(dibenzothiophen-4-yl)biphenyl-3-yl]dibenzo[f,h]quinoxaline (abbreviation: 2mDBTBPDBq-II), 4'-di(1-naphthyl)-4"-(9-phenyl-9H-carbazol-3-yl)triphenylamine (abbreviation: PCBNBB), and (acetylacetonato)bis(4,6-diphenylpyrimidinato)iridium(III) (abbreviation: Ir(dppm)$_2$(acac)) were deposited by co-evaporation, whereby a light-emitting layer 1113 was formed. Here, the weight ratio of 2mDBTBPDBq-II (abbreviation) to PCBNBB (abbreviation) and Ir(dppm)$_2$(acac) (abbreviation) was adjusted to 0.8:0.2:0.05 (=2mDBTBPDBq-II: PCBNBB: Ir(dppm)$_2$(acac)). The thickness of the light-emitting layer 1113 was set to 40 nm Next, 2mDBTBPDBq-II (abbreviation) was deposited to a thickness of 10 nm on the light-emitting layer 1113, whereby a first electron-transport layer 1114a was formed.

Note that 2mDBTBPDBq-II (abbreviation) used for the light-emitting layer 1113 and the first electron-transport layer 1114a in the light-emitting element 1 is an organic material of one embodiment of the present invention synthesized in Example 1, which can be obtained by coupling the aryl boronic acid (3-(dibenzothiophen-4-yl)phenylboronic acid) that is Sample 1 and the aryl halide (2-(3-bromophenyl) dibenzo[f,h]quinoxaline). As described above, the organic material (2mDBTBPDBq-II (abbreviation)) of one embodiment of the present invention, which uses the aryl boronic acid (3-(dibenzothiophen-4-yl)phenylboronic acid) that is Sample 1, can be used for the light-emitting layer and the electron-transport layer in the light-emitting element.

Next, bathophenanthroline (abbreviation: BPhen) was deposited to a thickness of 20 nm on the first electron-transport layer 1114a, whereby a second electron-transport layer 1114b was formed.

Next, lithium fluoride (LiF) was deposited by evaporation to a thickness of 1 nm on the second electron-transport layer 1114b, whereby an electron-injection layer 1115 was formed.

Lastly, aluminum (Al) was deposited by evaporation to a thickness of 200 nm as a second electrode 1103 which functions as a cathode. Through the above steps, the light-emitting element 1 of this example was manufactured.

Note that, in all the above evaporation steps, evaporation was performed by a resistance-heating method.

(Light-Emitting Element 2)

The light-emitting element 2 of this example was manufactured with the use of an element structure and a manufacturing method which are similar to those of the light-emitting element 1. Note that an organic material (2mDBTBPDq-II (abbreviation)) used for the light-emitting layer 1113 and the first electron-transport layer 1114a in the light-emitting element 2 is different from the organic material (2mDBTBP-DBq-II (abbreviation)) used in the light-emitting element 1. Specifically, 2mDBTBPDBq-II (abbreviation) used for the light-emitting layer 1113 and the first electron-transport layer 1114a in the light-emitting element 2 is an organic material of one embodiment of the present invention synthesized in Example 1, which can be obtained by coupling the aryl boronic acid (3-(dibenzothiophen-4-yl)phenylboronic acid) that is Sample 2 and the aryl halide (2-(3-bromophenyl) dibenzo[f,h]quinoxaline). As described above, the organic material (2mDBTBPDBq-II (abbreviation)) of one embodiment of the present invention, which uses the aryl boronic acid (3-(dibenzothiophen-4-yl)phenylboronic acid) that is Sample 2, can be used for the light-emitting layer and the electron-transport layer in the light-emitting element.

(Light-Emitting Element 3)

The light-emitting element 3 of this example was manufactured with the use of an element structure and a manufacturing method which are similar to those of the light-emitting element 1. Note that an organic material (2mDBTBPDBq-II (abbreviation)) used for the light-emitting layer 1113 and the first electron-transport layer 1114a in the light-emitting element 3 is different from the organic material (2mDBTBP-DBq-II (abbreviation)) used in the light-emitting element 1. Specifically, 2mDBTBPDBq-II (abbreviation) used for the light-emitting layer 1113 and the first electron-transport layer 1114a in the light-emitting element 3 is an organic material of one embodiment of the present invention synthesized in Example 1, which can be obtained by coupling the aryl boronic acid (3-(dibenzothiophen-4-yl)phenylboronic acid) that is Sample 3 and the aryl halide (2-(3-bromophenyl) dibenzo[f,h]quinoxaline). As described above, the organic material (2mDBTBPDq-II (abbreviation)) of one embodiment of the present invention, which uses the aryl boronic acid (3-(dibenzothiophen-4-yl)phenylboronic acid) that is Sample 3, can be used for the light-emitting layer and the electron-transport layer in the light-emitting element.

(Comparative Light-Emitting Element 4)

The comparative light-emitting element 4 of this example was manufactured with the use of an element structure and a manufacturing method which are similar to those of the light-emitting element 1. Note that the comparative light-emitting element 4 is different from the light-emitting element 1 in the thickness of the hole-injection layer 1111 and an organic material (2mDBTBPDBq-II (abbreviation)) used for the light-emitting layer 1113 and the first electron-transport layer 1114a. The hole-injection layer 1111 was formed by depositing 4,4',4"-(benzene-1,3,5-triyl)tri(dibenzothiophene) (abbreviation: DBT3P-II) and molybdenum oxide by co-evaporation. The thickness of the hole-injection layer 1111 was set to 40 nm, and the weight ratio of DBT3P-II (abbreviation) to molybdenum oxide was adjusted to 4:2 (=DBT3P-II:molybdenum oxide). Further, the organic material (2mDBTBP-DBq-II (abbreviation)) used for the light-emitting layer 1113 and the first electron-transport layer 1114a is an organic material of one embodiment of the present invention synthesized in Example 1, which can be obtained by coupling the aryl boronic acid (3-(dibenzothiophen-4-yl)phenylboronic acid) that is Sample 4 and the aryl halide (2-(3-bromophenyl) dibenzo[f,h]quinoxaline).

Table 2 shows element structures of the light-emitting elements 1 to 3 and the comparative light-emitting element 4.

TABLE 2

| | first electrode | hole-injection layer | hole-transport layer | light-emitting layer | first electron-transport layer | second electron-transport layer | electron-injection layer | second electrode |
|---|---|---|---|---|---|---|---|---|
| element 1 | ITSO 110 nm | DBT3P-II: MoOx (=4:2) 27 nm | BPAFLP 20 nm | | see below | | LiF 1 nm | Al 200 nm |
| element 2 | ITSO 110 nm | DBT3P-II: MoOx (=4:2) 27 nm | BPAFLP 20 nm | | see below | | LiF 1 nm | Al 200 nm |
| element 3 | ITSO 110 nm | DBT3P-II: MoOx (=4:2) 27 nm | BPAFLP 20 nm | | see below | | LiF 1 nm | Al 200 nm |
| comparative element 4 | ITSO 110 nm | DBT3P-II: MoOx (=4:2) 40 nm | BPAFLP 20 nm | | see below | | LiF 1 nm | Al 200 nm |

| | light-emitting layer | first electron-transport layer | second electron-transport layer |
|---|---|---|---|
| element 1 | 2mDBTBPDBq-II *1):PCBNBB:Ir(dppm)$_2$acac (0.8:0.2:0.05) 40 nm | 2mDBTBPDBq-II *1) 10 nm | BPhen 20 nm |
| element 2 | 2mDBTBPDBq-II *2):PCBNBB:Ir(dppm)$_2$acac (0.8:0.2:0.05) 40 nm | 2mDBTBPDBq-II *2) 10 nm | BPhen 20 nm |
| element 3 | 2mDBTBPDBq-II *3):PCBNBB:Ir(dppm)$_2$acac (0.8:0.2:0.05) 40 nm | 2mDBTBPDBq-II *3) 10 nm | BPhen 20 nm |

TABLE 2-continued

| comparative element 4 | 2mDBTBPDBq-II *4):PCBNBB:Ir(dppm)₂acac (0.8:0.2:0.05) 40 nm | 2mDBTBPDBq-II *4) 10 nm | BPhen 20 nm |

*1)2mDBTBPDBq-II synthesized using Sample 1
*2)2mDBTBPDBq-II synthesized using Sample 2
*3)2mDBTBPDBq-II synthesized using Sample 3
*4)2mDBTBPDBq-II synthesized using Sample 4

Next, in a glove box containing a nitrogen atmosphere, the light-emitting elements 1 to 3 and the comparative light-emitting element 4 were each sealed with a glass substrate so as not to be exposed to the air (specifically, a sealant was applied onto an outer edge of the element and heat treatment was performed at 80° C. for 1 hour at the time of sealing). Then, the operating characteristics of the light-emitting elements were measured. Note that the measurement was carried out at room temperature (in an atmosphere kept at 25° C.).

Figure 16:
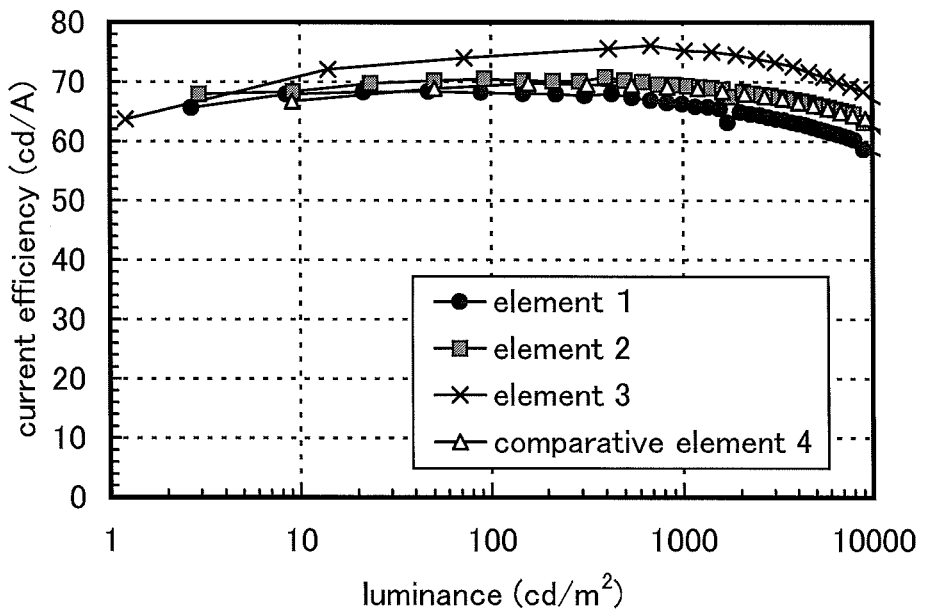
FIG. 16 shows current efficiency-luminance characteristics of the light-emitting elements in Example 2.
Figure 17:
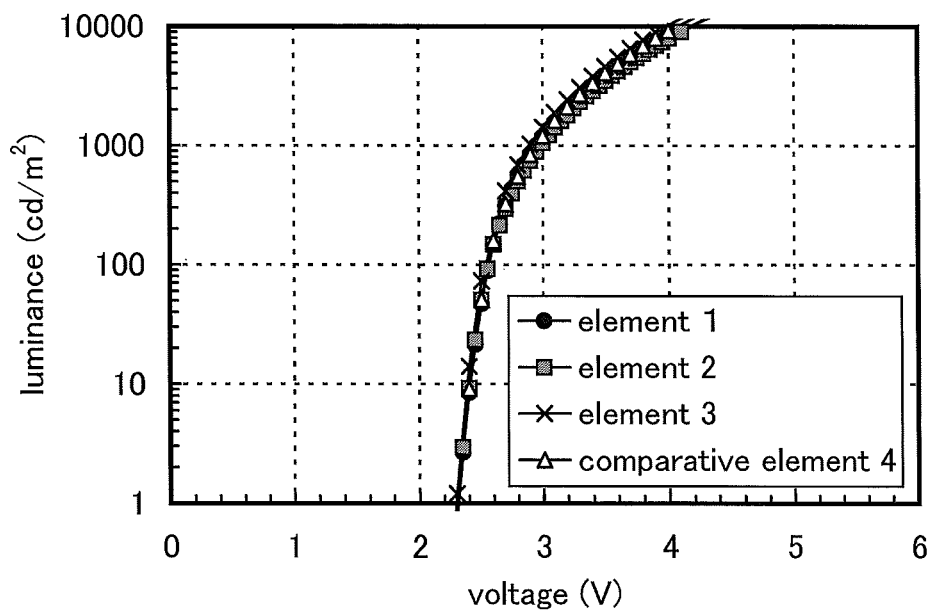
FIG. 17 shows luminance-voltage characteristics of the light-emitting elements in Example 2.

FIG. 16 shows current efficiency-luminance characteristics of the light-emitting elements 1 to 3 and the comparative light-emitting element 4. In FIG. 16, the horizontal axis represents luminance (cd/m²) and the vertical axis represents current efficiency (cd/A). FIG. 17 shows luminance-voltage characteristics of the light-emitting elements 1 to 3 and the comparative light-emitting element 4. In FIG. 17, the horizontal axis represents voltage (V) and the vertical axis represents luminance (cd/m²).

Table 3 shows the voltage (V), current density (mA/cm²), CIE chromaticity coordinates (x, y), current efficiency (cd/A), and external quantum efficiency (%) of each light-emitting element at a luminance of around 1000 cd/m².

invention, can have characteristics better than or equal to those of the comparative light-emitting element 4.

Figure 18:
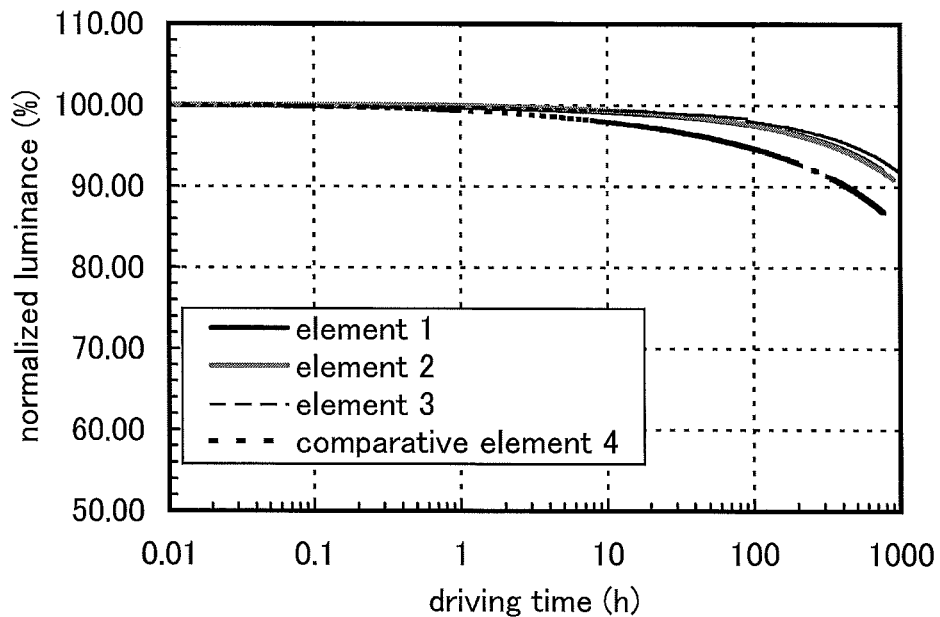
FIG. 18 shows results of a reliability test in Example 2.
Figure 19:
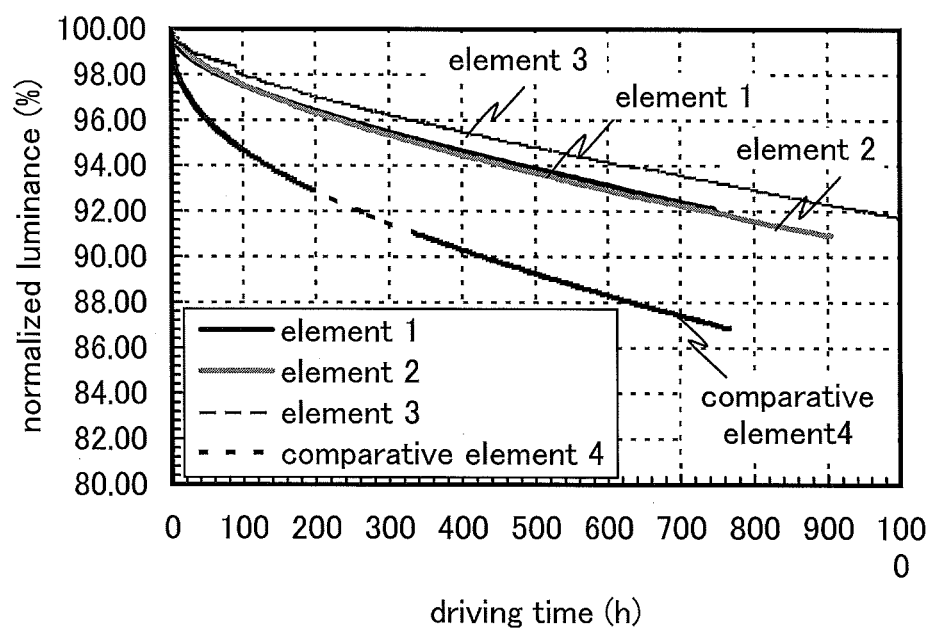
FIG. 19 shows results of the reliability test in Example 2.

Next, reliability tests were performed on the light-emitting elements 1 to 3 and the comparative light-emitting element 4. FIG. 18 and FIG. 19 show results of the reliability tests.

In the reliability test, each light-emitting element was driven under the conditions where the initial luminance was 5000 cd/m² and the current density was constant. The results are shown in FIG. 18 and FIG. 19. In FIG. 18, the horizontal axis represents driving time (h) of the elements on a logarithmic scale, and the vertical axis represents normalized luminance (%) in the range of 50% to 110% at regular intervals on the assumption that the initial luminance is 100%. In FIG. 19, meanwhile, the horizontal axis represents driving time (h) of the elements at regular intervals, and the vertical axis represents normalized luminance (%) in the range of 80% to 100% on the assumption that the initial luminance is 100%.

According to FIG. 18 and FIG. 19, the normalized luminances of the light-emitting element 1, the light-emitting element 2, the light-emitting element 3, and the comparative light-emitting element 4 at the time when 746 hours had passed were 92.10%, 91.95%, 93.3%, and 87.03%, respectively.

TABLE 3

| | voltage(V) | current density (mA/cm²) | CIE chromaticity coordinates | | luminance (cd/m²) | current efficiency (cd/A) | external quantum efficiency (%) |
| --- | --- | --- | --- | --- | --- | --- | --- |
| | | | x | y | | | |
| element 1 | 3.0 | 1.5 | 0.54 | 0.45 | 993 | 69 | 26 |
| element 2 | 3.0 | 1.5 | 0.55 | 0.45 | 1054 | 69 | 27 |
| element 3 | 2.9 | 1.4 | 0.55 | 0.45 | 1021 | 75 | 29 |
| comparative element 4 | 2.9 | 1.2 | 0.57 | 0.43 | 833 | 69 | 29 |

As shown in Table 3, the current efficiency and external quantum efficiency of the light-emitting element 1 were 69 cd/A and 26%, respectively, at a luminance of 993 cd/m². The current efficiency and external quantum efficiency of the light-emitting element 2 were 69 cd/A and 27%, respectively, at a luminance of 1054 cd/m². The current efficiency and external quantum efficiency of the light-emitting element 3 were 75 cd/A and 29%, respectively, at a luminance of 1021 cd/m². The current efficiency and external quantum efficiency of the comparative light-emitting element 4 were 69 cd/A and 29%, respectively, at a luminance of 833 cd/m².

The CIE chromaticity coordinates (x, y) of the light-emitting element 1 were (0.54, 0.45) at a luminance of 993 cd/m². The CIE chromaticity coordinates (x, y) of the light-emitting element 2 were (0.55, 0.45) at a luminance of 1054 cd/m². The CIE chromaticity coordinates (x, y) of the light-emitting element 3 were (0.55, 0.45) at a luminance of 1021 cd/m². The CIE chromaticity coordinates (x, y) of the comparative light-emitting element 4 were (0.57, 0.43) at a luminance of 833 cd/m².

The above results demonstrate that the light-emitting elements 1 to 3, each of which is one embodiment of the present The above results demonstrate that the light-emitting elements 1 to 3, each of which is one embodiment of the present invention, have longer lifetimes than the comparative light-emitting element 4.

The light-emitting elements 1 to 3 and the comparative light-emitting element 4 have the same element structure but are different from each other in the impurity concentration of the aryl boronic acid (3-(dibenzothiophen-4-yl)phenylboronic acid) used for synthesizing the organic material (2mDBTBPDBq-II (abbreviation)) used for the light-emitting layer and the first electron-transport layer.

In the aryl boronic acid (Sample 1) used in the light-emitting element 1, the concentration of an impurity other than the first impurity (m/z 260) and the second impurity (m/z 276 or m/z 277) was 1% or lower, specifically, 0.7%. In the aryl boronic acid (Sample 2) used in the light-emitting element 2, the concentration of an impurity other than the first impurity (m/z 260) and the second impurity (m/z 276 or m/z 277) was 1% or lower, specifically, 0%. In the aryl boronic acid (Sample 3) used in the light-emitting element 3, the concentration of an impurity other than the first impurity (m/z 260) and the second impurity (m/z 276 or m/z 277) was 1% or lower, specifically, 0.9%. In the aryl boronic acid (Sample 4) used in the comparative light-emitting element 4, the concentration of an impurity other than the first impurity (m/z 260) and the second impurity (m/z 276 or m/z 277) was 1.6%.

The above results show that the light-emitting elements 1 to 3, each of which is one embodiment of the present invention, have lower impurity concentrations of the aryl boronic acid (3-(dibenzothiophen-4-yl)phenylboronic acid which was used for obtaining the organic material (2mDBTBPDBq-II (abbreviation)) used for the light-emitting layers and the first electron-transport layers than the comparative light-emitting element 4. The difference in the impurity concentration has an effect on the reliability of each light-emitting element. Note that the difference in the thickness of the hole-transport layer between the light-emitting elements 1 to 3 and the comparative light-emitting element 4 has few effects on the reliability of each light-emitting element.

As described above, the impurity concentration of the aryl boronic acid used for coupling for synthesizing the organic material is lowered, so that the reliability of the light-emitting elements can be improved.

This application is based on Japanese Patent Application serial no. 2012-126112 filed with Japan Patent Office on Jun. 1, 2012, the entire contents of which are hereby incorporated by reference.

What is claimed is:

1. A method for manufacturing a light-emitting element comprising the steps of:
 forming a first electrode;
 forming a second electrode; and
 forming an EL layer including an organic compound between the first electrode and the second electrode,
  wherein the organic compound is prepared by coupling an aryl halide and an aryl boronic acid or an aryl boronic acid ester, and
 wherein the aryl boronic acid or the aryl boronic acid ester is purified by treatment with a polyol before the coupling.

2. The method for manufacturing a light-emitting element according to claim 1, wherein the polyol is sorbitol.

3. The method for manufacturing a light-emitting element according to claim 1,
 wherein the purification is performed to reduce a concentration of an impurity to 1% or lower,
 wherein the impurity is an impurity other than a first impurity and a second impurity,
 wherein the first impurity is an arene obtained by substituting a boryl group of the aryl boronic acid or the aryl boronic acid ester with hydrogen, and
 wherein the second impurity has a molecular mass larger than the first impurity by 16 or 17.

4. The method for manufacturing a light-emitting element according to claim 1, wherein the EL layer includes a plurality of layers.

5. A method for manufacturing an organic compound comprising the steps of:
 purifying an aryl boronic acid or an aryl boronic acid ester by treatment with a polyol; and
 coupling an aryl halide and the aryl boronic acid or the aryl boronic acid ester,
 wherein the aryl boronic acid or the aryl boronic acid ester is represented by General Formula (G2),

wherein $Ar^2$ represents a substituted or unsubstituted aryl group having 6 to 13 carbon atoms,
 wherein $R^1$ and $R^2$ each represent any of hydrogen and an alkyl group having 1 to 6 carbon atoms, and
 wherein the aryl boronic acid or the aryl boronic acid ester has a molecular mass of 100 to 1000.

6. The method for manufacturing an organic compound according to claim 5, wherein the polyol is sorbitol.

7. The method for manufacturing an organic compound according to claim 5,
 wherein the purification is performed to reduce a concentration of an impurity to 1% or lower,
 wherein the impurity is an impurity other than a first impurity and a second impurity,
 wherein the first impurity is an arene obtained by substituting a boryl group of the aryl boronic acid or the aryl boronic acid ester with hydrogen, and
 wherein the second impurity has a molecular mass larger than the first impurity by 16 or 17.

8. The method for manufacturing an organic compound according to claim 5, wherein the aryl boronic acid or the aryl boronic acid ester is a phenylboronic acid having a substituent.

9. The method for manufacturing an organic compound according to claim 8, wherein a skeleton of the substituent includes a condensed heteroaromatic ring.

10. The method for manufacturing an organic compound according to claim 9, wherein the condensed heteroaromatic ring is a dibenzothiophene ring or a dibenzofuran ring.

11. A method for manufacturing a light-emitting element comprising the steps of:
 forming a first electrode;
 forming a second electrode; and
 forming an EL layer including an organic compound between the first electrode and the second electrode,
 wherein the organic compound is prepared by coupling an aryl halide and an aryl boronic acid or an aryl boronic acid ester,
 wherein the aryl boronic acid or the aryl boronic acid ester is purified by treatment with a polyol before the coupling to reduce a concentration of an impurity in the aryl boronic acid or the aryl boronic acid ester before the coupling,
 wherein the aryl boronic acid or the aryl boronic acid ester is represented by General Formula (G2),

wherein $Ar^2$ represents a substituted or unsubstituted aryl group having 6 to 13 carbon atoms,
 wherein $R^1$ and $R^2$ each represent any of hydrogen and an alkyl group having 1 to 6 carbon atoms, and
 wherein the aryl boronic acid or the aryl boronic acid ester has a molecular mass of 100 to 1000.

12. The method for manufacturing a light-emitting element according to claim 11,
   wherein the concentration of the impurity is reduced to 1% or lower,
   wherein the impurity is an impurity other than a first impurity and a second impurity,
   wherein the first impurity is an arene obtained by substituting a boryl group of the aryl boronic acid or the aryl boronic acid ester with hydrogen, and
   wherein the second impurity has a molecular mass larger than the first impurity by 16 or 17.

13. The method for manufacturing a light-emitting element according to claim 11, wherein the EL layer includes a plurality of layers.

14. The method for manufacturing a light-emitting element according to claim 11, wherein the aryl boronic acid or the aryl boronic acid ester is a phenylboronic acid having a substituent.

15. The method for manufacturing a light-emitting element according to claim 14, wherein a skeleton of the substituent includes a condensed heteroaromatic ring.

16. The method for manufacturing a light-emitting element according to claim 15, wherein the condensed heteroaromatic ring is a dibenzothiophene ring or a dibenzofuran ring.

17. The method for manufacturing a light-emitting element according to claim 11, wherein the aryl boronic acid or the aryl boronic acid ester is prepared from a second aryl halide with a purity equal to or higher than 90%.

* * * * *